United States Patent
Nishimura

(10) Patent No.: US 6,621,193 B1
(45) Date of Patent: Sep. 16, 2003

(54) THICKNESS EXTENSIONAL VIBRATION MODE PIEZOELECTRIC RESONATOR, LADDER-TYPE FILTER, AND PIEZOELECTRIC RESONATOR COMPONENT

(75) Inventor: Toshio Nishimura, Shiga-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/648,523

(22) Filed: Aug. 26, 2000

(30) Foreign Application Priority Data

Aug. 26, 1999 (JP) ............................................. 11-240113

(51) Int. Cl.$^7$ .................................................. H01L 41/08
(52) U.S. Cl. ......................................... 310/320; 310/366
(58) Field of Search ................................. 310/320, 366, 310/367, 368

(56) References Cited

U.S. PATENT DOCUMENTS

| | | | |
|---|---|---|---|
| 4,652,784 A | | 3/1987 | Inoue et al. |
| 4,894,580 A | * | 1/1990 | Ogawa ........................ 310/320 |
| 4,939,403 A | * | 7/1990 | Kitaka et al. ................ 310/320 |
| 5,045,744 A | | 9/1991 | Ando et al. |
| 5,084,647 A | | 1/1992 | Inoue et al. |
| 6,040,652 A | * | 3/2000 | Kaida ......................... 310/320 |
| 6,051,910 A | * | 4/2000 | Kaida et al. ................ 310/320 |
| 6,051,916 A | * | 4/2000 | Kaida et al. |
| 6,232,698 B1 | * | 5/2001 | Kaida et al. ................ 310/320 |

FOREIGN PATENT DOCUMENTS

| | | |
|---|---|---|
| JP | 5-714315 A | 9/1982 |
| JP | 63-040491 | 8/1988 |
| JP | 1-191508 | 8/1989 |
| JP | 8-154032 | 6/1996 |
| JP | 10-65485 | 3/1998 |
| JP | 11-4133 | 1/1999 |
| JP | 11-4134 | 1/1999 |
| JP | 11-4135 | 1/1999 |
| JP | 11-27083 | 1/1999 |

\* cited by examiner

Primary Examiner—Mark O. Budd
(74) Attorney, Agent, or Firm—Keating & Bennett, LLP

(57) ABSTRACT

A thickness extensional vibration mode piezoelectric resonator includes a piezoelectric body having piezoelectric layers and N internal electrodes disposed therein, where N is an integer equal to 3 to 5. Electric fields of opposite polarity are applied alternately in the direction of thickness to the piezoelectric layers located between the internal electrodes. When the thickness of a piezoelectric layer between adjacent internal electrodes in the direction of thickness is denoted by D and the thicknesses of a first and second piezoelectric layer outside the outermost internal electrodes in the direction of thickness are denoted by $D_1$ and $D_2$, the following relationships are satisfied: $0.50 \leq (D_1+D_2)/2D \leq 1.00$ at N=3, $0.50 \leq (D_1+D_2)/2D \leq 0.90$ at N=4, and $0.50 \leq (D_1+D_2)/2D \leq 0.80$ at N=5.

16 Claims, 24 Drawing Sheets

THICKNESS EXTENSIONAL VIBRATION MODE PIEZOELECTRIC RESONATOR, LADDER-TYPE FILTER, AND PIEZOELECTRIC RESONATOR COMPONENT

BACKGROUND OF THE INVENTION

1. Field of the Invention

The present invention relates to a thickness extensional piezoelectric resonator using harmonics of a thickness extensional vibration mode, and more particularly, to a thickness extensional piezoelectric resonator for use as a series-arm resonator and a parallel-arm resonator in a ladder-type filter, and a ladder-type filter and piezoelectric resonator component including such a piezoelectric resonator.

2. Description of the Related Art

Piezoelectric resonators are used in various piezoelectric resonator components such as piezoelectric oscillators, discriminators, and piezoelectric filters. Known piezoelectric resonators of this kind utilize various piezoelectric vibration modes, depending on the frequency to be used.

An energy-trap piezoelectric resonator utilizing a higher-mode of a thickness extensional vibration mode is disclosed in Japanese Examined Patent Application Publication No. 63-40491.

That is, a thickness extensional piezoelectric resonator having a plurality of internal electrodes arranged one on top of another and separated by piezoelectric layers made of a piezoelectric ceramic material and where the piezoelectric layers between internal electrodes are polarized in opposite directions alternately in the direction of thickness is known.

However, although the above-mentioned prior art utilizes harmonics of a thickness extensional vibration mode by disposing a plurality of internal electrodes in a piezoelectric body, only a few examples are disclosed regarding the question of where the internal electrodes are located and arranged. That is, in the above-mentioned prior art, only the embodiments where adjacent internal electrodes are spaced 73 μm away from each other and the whole thickness of the piezoelectric body is 259 μm or 257 μm are shown as a piezoelectric resonator utilizing a third-order thickness extensional vibration mode.

The thickness extensional piezoelectric resonators utilizing harmonics of a thickness extensional vibration mode as described above are manufactured using a mother piezoelectric substrate. Then, since warping or other deformities occur in the mother piezoelectric substrate, surface grinding is often performed. Because of the grinding, the location of the internal electrodes varies in the direction of thickness in the piezoelectric substrate and the frequencies therefore fluctuate. In particular, the higher frequencies in which the thickness extensional piezoelectric resonator is used, the more frequency fluctuations that the piezoelectric resonator exhibits, and this fact is an obstacle to using a thickness extensional piezoelectric resonator for higher frequencies.

Up to now, a ladder-type filter having a series-arm resonator and a parallel-arm resonator is widely used as a bandpass filer. In the ladder-type filter in which the series-arm resonator and parallel-arm resonator are composed of energy-trap thickness extensional piezoelectric resonators, the package construction can be simplified. However, when the above-mentioned piezoelectric resonator utilizing harmonics of a thickness extensional vibration mode is used, because the accuracy of resonant frequencies and antiresonant frequencies are not adequate as described above, it is difficult to achieve excellent filtering characteristics.

SUMMARY OF THE INVENTION

In order to overcome the problems described above, preferred embodiments of the present invention provide an energy-trap thickness extensional piezoelectric resonator utilizing harmonics of a thickness extensional vibration mode having a greatly increased accuracy of frequencies and operating at much higher frequencies, a thickness extensional piezoelectric resonator defining a series-arm resonator and a parallel-arm resonator of a ladder-type filter, and a piezoelectric resonator component.

Other preferred embodiments of the present invention provide a ladder-type filter including a thickness extensional piezoelectric resonator according to other preferred embodiments of the present invention, which defines a series-arm resonator or a parallel-arm resonator, such that excellent filtering characteristics are achieved and higher frequencies can be used.

A first preferred embodiment of the present invention provides an energy-trap thickness extensional vibration mode piezoelectric resonator to be used as a series-arm resonator of a ladder-type filter including a piezoelectric body uniformly polarized in the direction of thickness and N number of internal electrodes, where N is an integer equal to 3 to 5, disposed in the piezoelectric body and stacked on each other with piezoelectric layers disposed therebetween. The $(N-1)$th higher-order mode of a thickness extensional vibration mode generated by applying electric fields of opposite polarity alternately in the direction of thickness to piezoelectric layers between internal electrodes is utilized. When the thickness of a piezoelectric layer between adjacent internal electrodes in the direction of thickness is denoted by D and the thicknesses of a first and second piezoelectric layer outside the outermost internal electrodes in the direction of thickness are denoted by $D_1$ and $D_2$, the following relationships are defined: $0.50 \leq (D_1+D_2)/2D \leq 1.00$ at N=3, $0.50 \leq (D_1+D_2)/2D \leq 0.90$ at N=4, and $0.50 \leq (D_1+D_2)/2D \leq 0.80$ at N=5.

A second preferred embodiment of the present invention provides an energy-trap thickness extensional vibration mode piezoelectric resonator defining a parallel-arm resonator of a ladder-type filter including a piezoelectric body uniformly polarized in the direction of thickness and N number of internal electrodes, where N is an integer equal to 3 to 5, which are disposed in the piezoelectric body and stacked on each other with piezoelectric layers disposed therebetween. The $(N-1)$th higher-order mode of a thickness extensional vibration mode generated by applying electric fields of opposite polarity alternately in the direction of thickness to piezoelectric layers between internal electrodes is utilized. When the thickness of a piezoelectric layer between adjacent internal electrodes in the direction of thickness is denoted by D and the thicknesses of a first and second piezoelectric layer outside the outermost internal electrodes in the direction of thickness are denoted by $D_1$ and $D_2$, the following relationships are satisfied: $0.10 \leq (D_1+D_2)/2D \leq 0.80$ at N=3, $0.10 \leq (D_1+D_2)/2D \leq 0.50$ at N=4, and $0.10 \leq (D_1+D_2)/2D \leq 0.45$ at N=5.

A third preferred embodiment of the present invention provides an energy-trap thickness extensional vibration mode piezoelectric resonator defining a series-arm resonator of a ladder-type filter including a piezoelectric body and N number of internal electrodes, wherein N is equal to an integer equal to 3 to 5, disposed in the piezoelectric body and stacked on each other with piezoelectric layers disposed therebetween. The piezoelectric layers between internal electrodes are polarized in opposite direction alternately in the direction of thickness and the (N−1)th higher-order mode of a thickness extensional vibration mode is utilized. When the thickness of a piezoelectric layer between adjacent internal electrodes in the direction of thickness is denoted by D and the thicknesses of a first and second piezoelectric layer outside the outermost internal electrodes in the direction of thickness are denoted by $D_1$ and $D_2$, the following relationships are satisfied: $0.60 \leq (D_1+D_2)/2D \leq 1.10$ at N=3, $0.65 \leq (D_1+D_2)/2D \leq 0.90$ at N=4, and $0.60 \leq (D_1+D_2)/2D \leq 0.80$ at N=5.

A preferred embodiment of the present invention provides an energy-trap thickness extensional vibration mode piezoelectric resonator defining a parallel-arm resonator of a ladder-type filter including a piezoelectric body and N number of internal electrodes, where N is an integer equal to 3 to 5, disposed in the piezoelectric body and stacked on each other with piezoelectric layers disposed therebetween. The piezoelectric layers between internal electrodes are polarized in opposite direction alternately in the direction of thickness and the (N−1)th higher-order mode of a thickness extensional vibration mode is utilized. When the thickness of a piezoelectric layer between adjacent internal electrodes in the direction of thickness is denoted by D and the thicknesses of a first and second piezoelectric layer outside the outermost internal electrodes in the direction of thickness are denoted by $D_1$ and $D_2$, the following relationships are satisfied: $0.10 \leq (D_1+D_2)/2D \leq 1.10$ at N=3, $0.1023 (D_1+D_2)/2D \leq 0.90$ at N=4, and $0.10 \leq (D_1+D_2)/2D \leq 0.80$ at N=5.

A ladder-type filter according to one of the preferred embodiments of present invention includes a series-arm resonator and a parallel-arm resonator. The series-arm resonator includes a thickness extensional vibration mode piezoelectric resonator according to the first or third preferred embodiment of the present invention.

A ladder-type filter according to another preferred embodiment of the present invention includes a series-arm resonator and a parallel-arm resonator. The parallel-arm resonator includes a thickness extensional vibration mode piezoelectric resonator according to the second or fourth preferred embodiment of the present invention.

In a thickness extensional vibration mode piezoelectric resonator according to the first through fourth preferred embodiments of the invention, the plurality of internal electrodes preferably include linear electrodes and intersect with each other through piezoelectric layers, and the intersection portion constitutes an energy-trap type piezoelectric vibration portion.

A piezoelectric resonator component according to a further preferred embodiment of the present invention includes at least a thickness extensional vibration mode piezoelectric resonator according to any one of the first to fourth preferred embodiments of the present invention, a case substrate bonded to the piezoelectric resonator with a space for allowing the piezoelectric resonator to vibrate unhindered, and a conductive cap bonded to the case substrate so as to enclose the piezoelectric resonator.

Other features, elements, characteristics and advantages of the present invention will become more apparent from detailed description of preferred embodiments thereof with reference to the attached drawings.

DETAILED DESCRIPTION OF PREFERRED EMBODIMENTS

Figure 1:
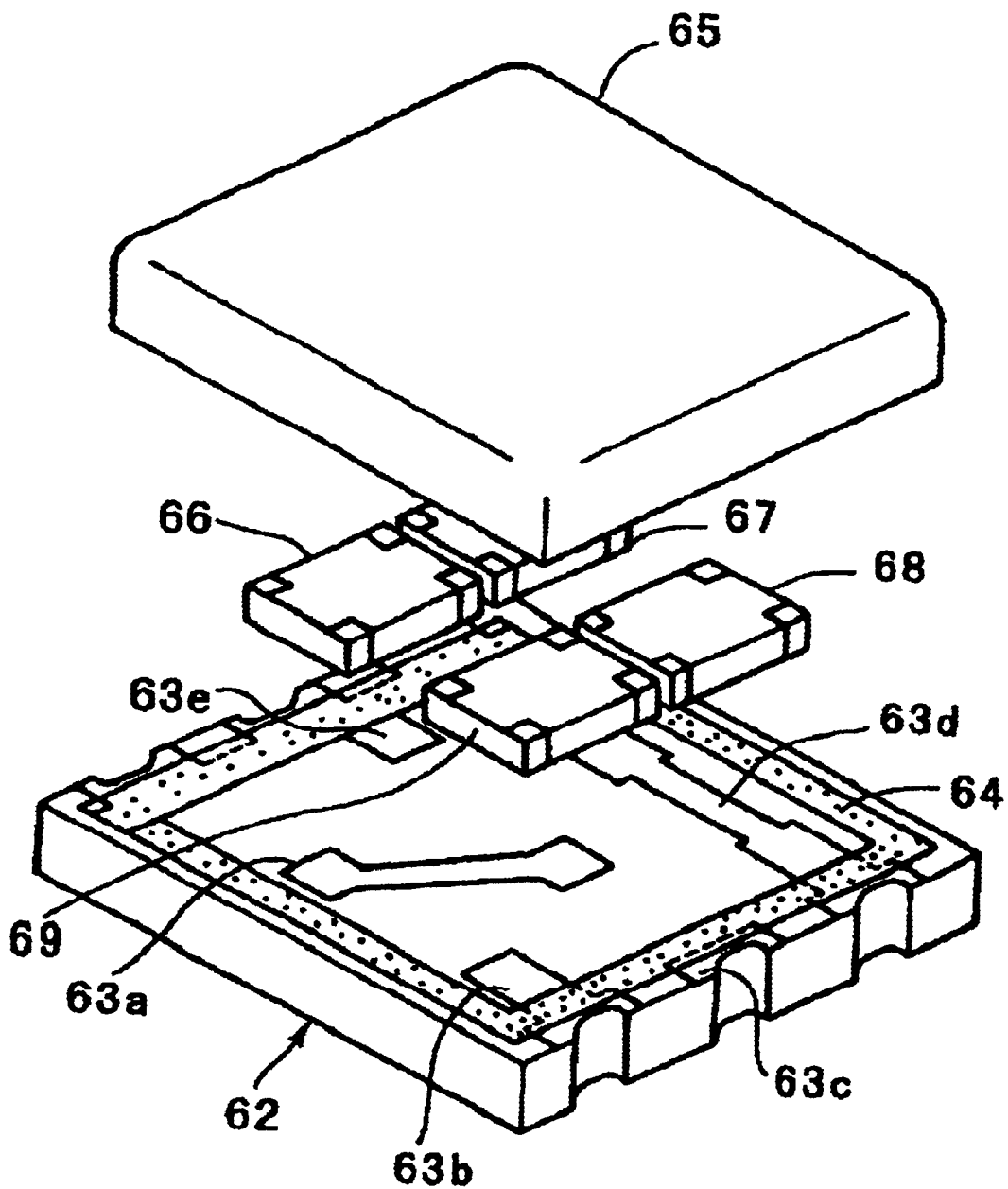
FIG. 1 is an exploded perspective view of a ladder-type filter according to a first preferred embodiment of the present invention.
Figure 2:
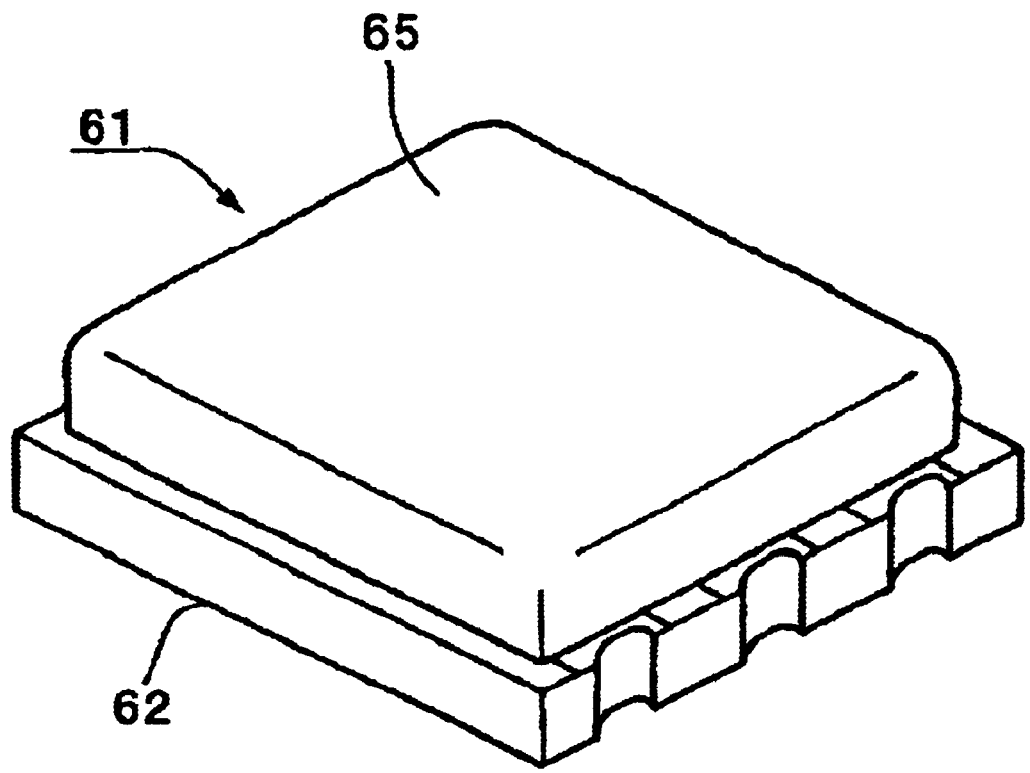
FIG. 2 is a perspective view showing the appearance of the ladder-type filter shown in FIG. 1.

FIGS. 1 and 2 are an exploded perspective view for illustrating a ladder-type filter according to a first preferred embodiment of the present invention and a perspective view showing the appearance of the filter, respectively.

A ladder-type filter 61 preferably has a package structure including a case substrate 62 and a metal cap 65. The case substrate 62 is preferably made of an insulating ceramic material such as alumina or an appropriate insulating material such as synthetic resin, or other suitable material. Electrodes 63a–63e are provided on the upper surface of the case substrate 62. The electrodes 63a–63e are electrically connected to a thickness extensional vibration mode piezoelectric resonator to be described later, and some of the electrodes 63a–63e are extended to the side surfaces of the case substrate 62 so as to define terminal electrodes for making electrical connection to external independent components.

On the upper surface of the case substrate 62, an insulating film 64 having a substantially rectangular frame shape is provided. The insulating film 64 is arranged such that when the metal cap 65 is joined to the case substrate 62, the metal cap 65 is electrically insulated from the electrodes 63a–63e, etc.

The metal cap 65 having an opening facing downward is joined to the case substrate 62 preferably via an insulating adhesive (not illustrated) or other suitable joining material or method. In this way, the construction of a package where the internal space is sealed can be obtained. In order to provide a conductive cap, an insulating material cap the surface of which is coated with a conductive material may be used instead of the metal cap 65.

Further, in the above-mentioned internal space, four thickness extensional vibration mode piezoelectric resonators 66–69 are preferably connected to the electrodes 63a–63e through a conductive adhesive or a conductive bonding agent such as solder, or other suitable connector.

Figure 3:
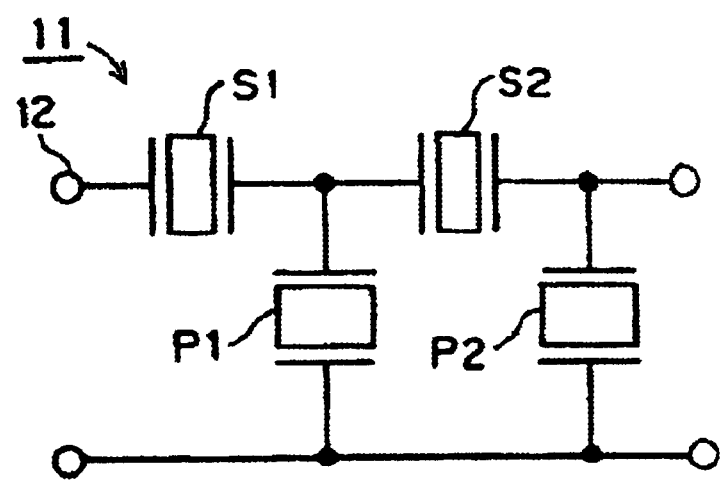
FIG. 3 is a diagram showing the circuit configuration of the ladder-type filter shown in FIG. 2.

The piezoelectric resonators 66–69 are electrically connected to each other by the electrodes 63a–63e so that, out of piezoelectric resonators 66–69, the piezoelectric resonators 68 and 69 constitute series-arm resonators and the piezoelectric resonators 66 and 67 constitute parallel-arm resonators. That is, the ladder-type filter 61 according to the present preferred embodiment constitutes a ladder-type circuit shown in FIG. 3.

The ladder-type filter 61 of the present preferred embodiment is characterized in that the piezoelectric resonators 68 and 69, that is, the series-arm resonators include a thickness extensional vibration mode piezoelectric resonator according to the first and third preferred embodiments of the present invention, and in that the piezoelectric resonators 66 and 67, that is, the parallel-arm resonators, include a thickness extensional vibration mode piezoelectric resonator according to the second and fourth preferred embodiments of the present invention described later. As a result of this novel construction and arrangement, the variation in accuracies of the frequencies is minimized and excellent filtering characteristics are obtained.

As a second preferred embodiment of the present invention, a thickness extensional vibration mode piezoelectric resonator according to the first and second preferred embodiments of the present invention is explained.

Figure 4A:
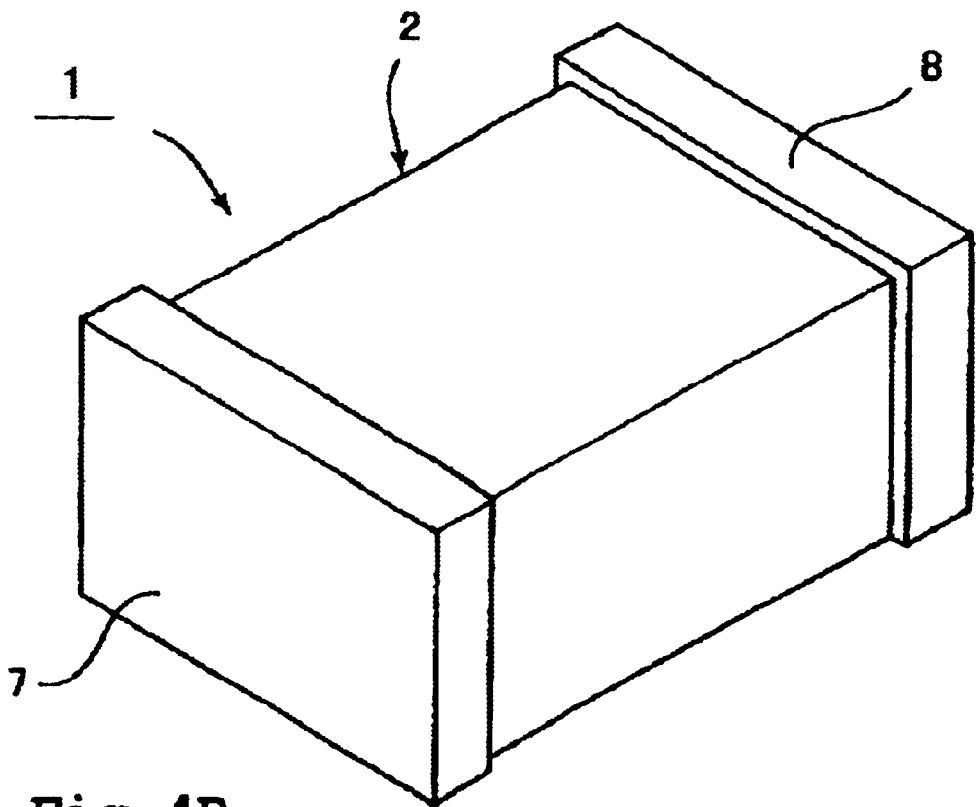
FIGS. 4A and 4B are a perspective view and a sectional view of a thickness extensional piezoelectric resonator utilizing the third harmonic of a thickness extensional vibration mode according to a second preferred embodiment of the present invention.
Figure 4B:
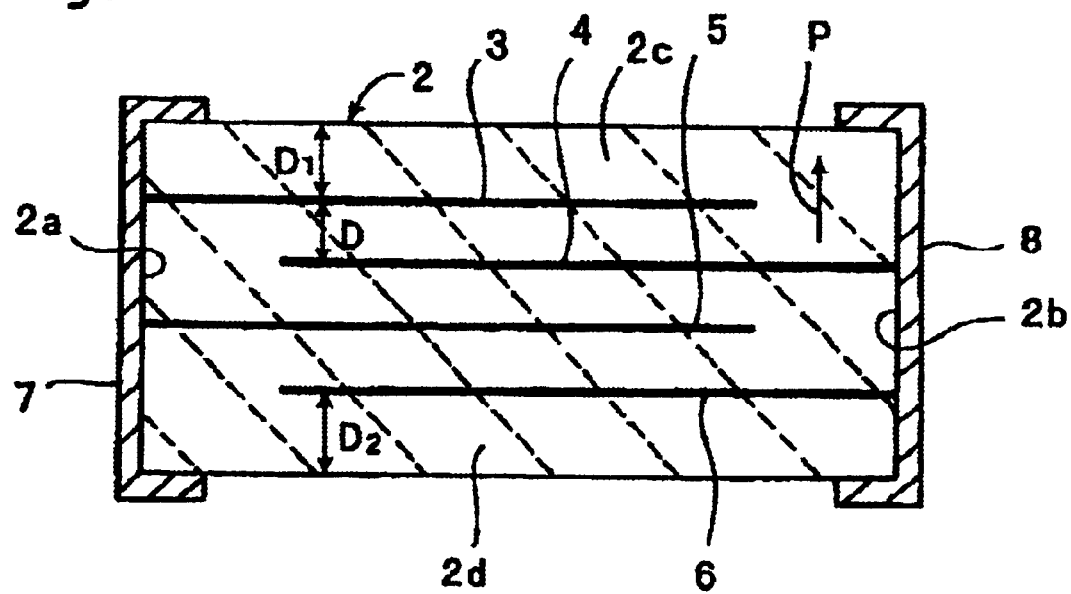

FIGS. 4A and 4B are a perspective view and a sectional view for explaining a thickness extensional vibration mode piezoelectric resonator according to a second preferred embodiment of the present invention.

A thickness extensional vibration mode piezoelectric resonator 1 includes a piezoelectric body 2 having a substantially rectangular shape which is made of a piezoelectric ceramic material such as a lead zirconate titanate-based ceramic or a piezoelectric single crystal such as quartz and lithium tantalum oxide, or other suitable material. Inside the piezoelectric body 2, a plurality of internal electrodes 3–6 are arranged on piezoelectric layers and stacked on each other with the piezoelectric layers disposed therebetween.

The piezoelectric body 2 is polarized uniformly in the direction of thickness as indicated by the arrow P.

The internal electrodes 3 and 5 are extended to one end surface 2a of the piezoelectric body 2, and the internal electrodes 4 and 6 are extended to the end surface 2b on the opposite side facing the end surface 2a.

External electrodes 7 and 8 are arranged so as to cover the end surfaces 2a and 2b. The external electrodes 7 and 8 are preferably formed by coating and curing conductive paste or by sputtering, evaporating, or plating metal material, or other suitable process.

The external electrode 7 is electrically connected to the internal electrodes 3 and 5. The external electrode 8 is electrically connected to the internal electrodes 4 and 6.

In the thickness extensional vibration mode piezoelectric resonator 1, when an AC voltage is applied between the external electrode 7 and 8, electric fields of opposite polarity are applied to the piezoelectric layer between the internal electrodes 3 and 4 and the piezoelectric layer between the internal electrodes 4 and 5. Similarly, electric fields of opposite polarity are applied to the piezoelectric layer between the internal electrodes 4 and 5 and the piezoelectric layer between the internal electrodes 5 and 6 alternately. Therefore, a portion where the internal electrodes 3–6 overlap in the direction of thickness resonates and functions as an energy-trap thickness extensional vibration mode piezoelectric resonator. In this case, because the number of the internal electrodes is four, the piezoelectric resonator functions as a thickness extensional vibration mode piezoelectric resonator utilizing the third harmonic of a thickness extensional vibration mode.

Hereinafter, a thickness extensional vibration mode piezoelectric resonator where the piezoelectric body is polarized uniformly and electric fields of opposite polarity are applied to the piezoelectric layers between adjacent internal electrodes alternately in the direction of thickness is defined as a thickness extensional vibration mode piezoelectric resonator of parallel-connection type.

Regarding the thickness extensional vibration mode piezoelectric resonator 1 of the present preferred embodiment, the piezoelectric body 2 can be obtained by known integral sintering techniques of ceramic materials, or other suitable processes.

Figure 5:
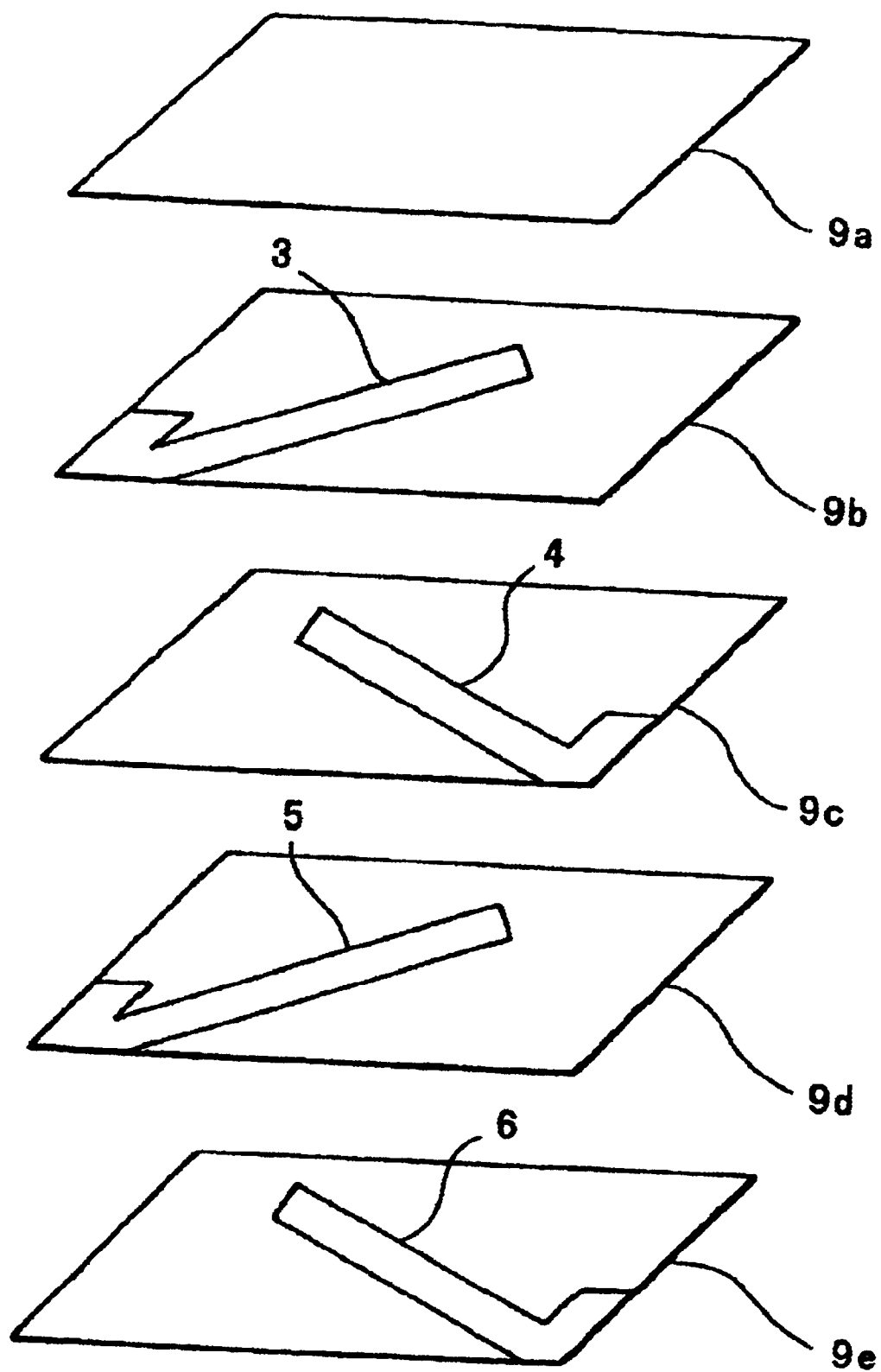
FIG. 5 is an exploded perspective view illustrating the configuration of internal electrodes used for constructing the piezoelectric body of the thickness extensional vibration mode piezoelectric resonator according to the second preferred embodiment of the present invention.

For example, as shown in FIG. 5, a plurality of green sheets 9a–9e having a piezoelectric ceramic material as a major constituent are prepared, and linear internal electrodes 3–6 are formed by screen printing of a conductive paste on the ceramic green sheets 9b–9c. Then, after the ceramic green sheets 9a–9e have been stacked one on top of another and pressure has been applied to the green sheets in the direction of thickness thereof, a piezoelectric body 2 can be obtained by sintering the green sheets.

In the present preferred embodiment, the internal electrodes 3–6 preferably have a substantially linear shape excluding the extension portion extending to the edge of the green sheets. Therefore, the portion where the internal electrodes overlap in the direction of thickness includes the portion where the substantially linear electrodes intersect. Accordingly, the area of the piezoelectric vibration portion of energy-trap type can be easily adjusted by adjustment of the intersecting area of the internal electrodes 3–6 and furthermore can be precisely adjusted. Therefore, in order to cope with higher frequencies, an energy trap type piezoelectric vibration portion having a very small area is easily formed.

Next, the characteristics of the thickness extensional vibration mode piezoelectric resonator 1 of the present preferred embodiment are explained.

In the thickness extensional vibration mode piezoelectric resonator 1 of the present preferred embodiment, when the thicknesses of a first and second piezoelectric layer 2c and 2d outside the portion where the plural internal electrodes 3–6 overlap one another, that is, outside the outermost internal electrode 3 or 6 are denoted by $D_1$ and $D_2$ and when the thickness of a piezoelectric layer between adjacent internal electrodes in the direction of thickness, for example, between the internal electrodes 3 and 4 is denoted by D, the thicknesses of the first and second piezoelectric layer 2c and 2d are chosen so as to meet the following formula (1A) or (1B).

$$0.50 \leq (D_1+D_2)/2D \leq 0.90 \quad (1A)$$

$$0.10 \leq (D_1+D_2)/2D \leq 0.50 \quad (1B)$$

In the thickness extensional vibration mode piezoelectric resonator of the present preferred embodiment, because the thicknesses of the first and second piezoelectric layer 2c and 2d are such that the formula (1A) or (1B) are satisfied, variations of the resonant frequencies and antiresonant frequencies can be effectively reduced. Hereinafter, this effect is explained.

In the manufacture of a thickness extensional vibration mode piezoelectric resonator 1, the thicknesses of the first and second piezoelectric layer 2c and 2d of the piezoelectric body 2 are ideally equal. That is, the internal electrodes 3–6 are preferably arranged so as to satisfy the condition of $D_1=D_2$.

However, the piezoelectric body 2 can be generally obtained by cutting a mother piezoelectric substrate. Then, there are cases where the mother piezoelectric substrate is slightly warped and in order to increase the flatness of the substrate, the upper surface or lower surface of the mother piezoelectric substrate is commonly surface ground.

Because of variations of the warping of the above mother substrate and variations of the amount of grinding of the upper surface or lower surface at the time when the mother substrate is surface ground, the portion where the internal electrodes 3–6 are stacked was likely to deviate from the above-mentioned ideal conditions.

Figure 6:
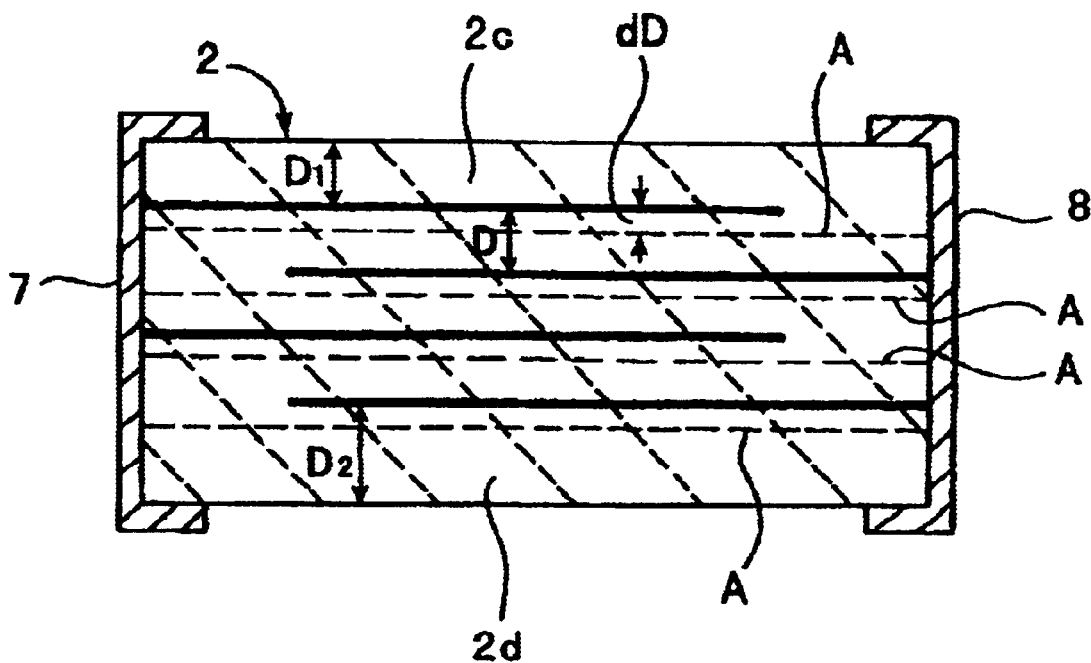
FIG. 6 is a sectional view illustrating the thicknesses of a first and second piezoelectric layer deviated from the ideal state because of the displacement of the internal electrodes in the thickness extensional vibration mode piezoelectric resonator of the second preferred embodiment of the present invention.

For example, as shown in FIG. 6, since the thickness D of each of the piezoelectric layers between the internal electrodes 3 and 4, between the internal electrodes 4 and 5, and between the internal electrodes 5 and 6 nearly corresponds to the thicknesses of the prepared green sheets, the thicknesses D can be made uniform. But when the piezoelectric body 2 is obtained from a piezoelectric substrate, the thicknesses $D_1$ and $D_2$ of the first and second piezoelectric layer 2c and 2d are likely to vary because of variations of the amount of grinding of the upper surface and lower surface and the warping of the piezoelectric substrate. Here, the broken lines A in FIG. 6 show the ideal location of the internal electrodes 3–6. The displacement of the internal electrodes 3–6 from the ideal location is defined as dD.

The inventor of the present application discovered that when the above internal electrodes 3–6 are displaced from their ideal location in the direction of thickness the resonant frequency, antiresonant frequency, and other characteristics vary and the degree of these variations depends on the thicknesses of the first and second piezoelectric layer 2c and 2d of the outermost piezoelectric layers.

That is, the inventor of the present application discovered that in the case of a thickness extensional vibration mode piezoelectric resonator where the piezoelectric body 2 contains four internal electrodes 3–6 as described above and the third harmonic is utilized, it is sufficient to form the piezoelectric layers 2c and 2d meeting the above formula (1A) or (1B).

Figure 7:
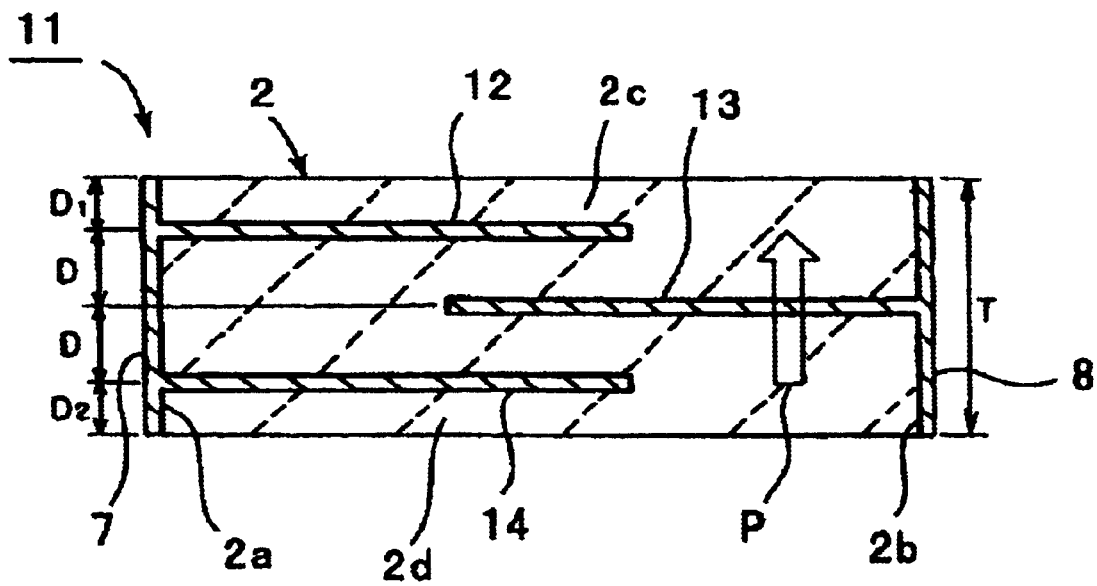
FIG. 7 is a sectional view of a thickness extensional vibration mode piezoelectric resonator utilizing the second harmonic according to a third preferred embodiment of the present invention.

Further, the inventor of the present application concerned changed the number of stacked internal electrodes and confirmed the resulting performance, and then discovered that in a thickness extensional vibration mode piezoelectric resonator 11 of parallel-connection type utilizing the second harmonic according to a third preferred embodiment which is shown in FIG. 7, when the piezoelectric layers 2c and 2d are formed so as to meet the following formula (2A) or (2B), variations of the resonant frequency or antiresonant frequency are greatly reduced.

$$0.50 \leq (D_1+D_2)/2D \leq 1.00 \quad (2A)$$

$$0.10 \leq (D_1+D_2)/2D \leq 0.80 \quad (2B)$$

Figure 8:
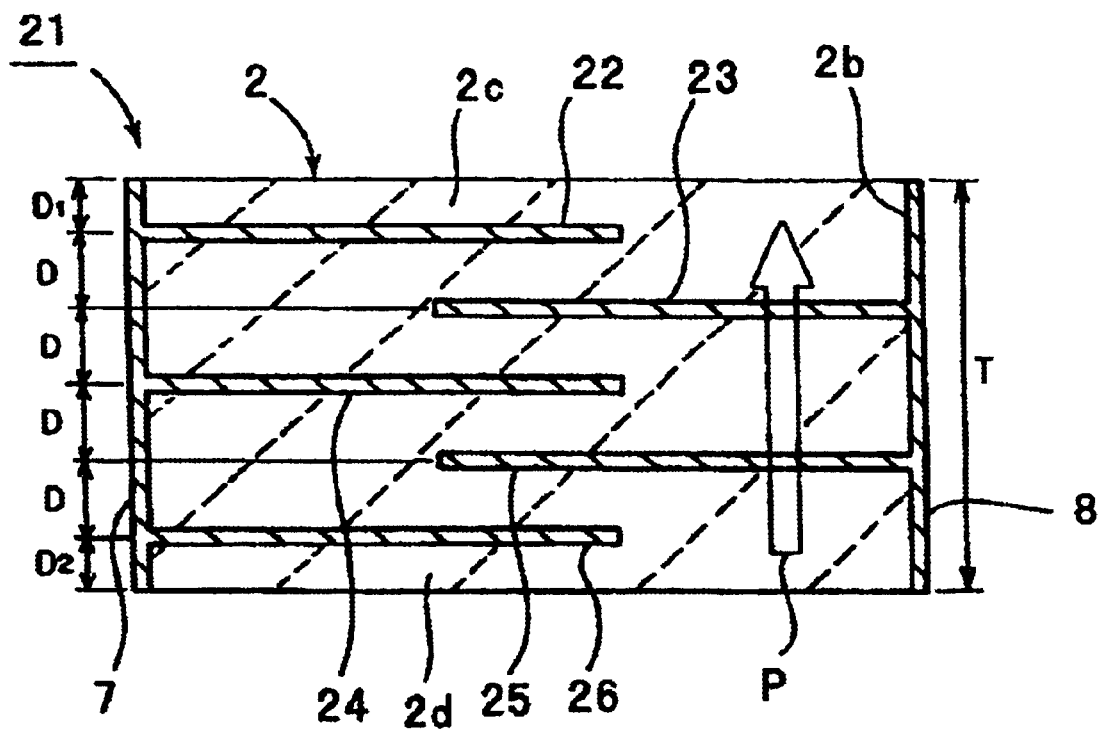
FIG. 8 is a sectional view of a thickness extensional vibration mode piezoelectric resonator of a parallel-connection type utilizing the fourth harmonic according to a fourth preferred embodiment of the present invention.

Further, in a thickness extensional vibration mode piezoelectric resonator 21 of parallel-connection type utilizing the fourth harmonic according to a fourth preferred embodiment which is shown in a sectional view of FIG. 8, when the thicknesses of the outermost piezoelectric layers 2c and 2d are controlled so as to meet the following formula (3A) or (3B), it was discovered that fluctuations of the resonant frequencies and antiresonant frequencies are minimized.

$$0.50 \leq (D_1+D_2)/2D \leq 0.80 \quad (3A)$$

$$0.10 \leq (D_1+D_2)/2D \leq 0.45 \quad (3B)$$

In the thickness extensional vibration mode piezoelectric resonator 11 utilizing the second harmonic that is shown in FIG. 7, the three internal electrodes 12–14 are arranged on the piezoelectric layers and stacked on each other with the piezoelectric layers disposed therebetween.

In the thickness extensional vibration mode piezoelectric resonator 21 utilizing the fourth harmonic that is shown in FIG. 8, the five internal electrodes 22–26 are arranged on the piezoelectric layers and stacked on each other with the piezoelectric layers disposed therebetween.

In the thickness extensional vibration mode piezoelectric resonators 11 and 21, the piezoelectric body 2 is polarized uniformly in the direction of the arrow P because the resonators are of parallel-connection type.

The thickness extensional vibration mode piezoelectric resonators 11 and 21 are preferably constructed in the same way as the thickness extensional vibration mode piezoelectric resonator 1 of the first preferred embodiment except that the number of the stacked internal electrodes and the higher mode being utilized are different.

Next, experimental examples are explained in a specific manner.

For the thickness extensional vibration mode piezoelectric resonator 11 utilizing the second harmonic, the thickness extensional vibration mode piezoelectric resonator 1 utilizing the third harmonic, and the thickness extensional vibration mode piezoelectric resonator 21 utilizing the fourth harmonic, the, piezoelectric bodies were made of a PT-based (lead titanate-based) ceramic material, the areas of the intersection portion of the internal electrodes, that is, the areas of the vibrating portions of energy-trap type were about 0.025 mm², the thickness of piezoelectric layers between adjacent internal electrodes was about 40 μm, and the thicknesses of the first and second piezoelectric layer $D_1$ and $D_2$ as the outermost layers were substantially equal (these $D_1$ and $D_2$ were defined as D', respectively). Then, when D'/D was variously changed, the rate of change $dF_r/F_r$ of resonant frequencies $F_r$ and the rate of change $dF_a/F_a$ of antiresonant frequencies $F_a$ were measured. The results are shown in FIGS. 13–18.

Figure 13:
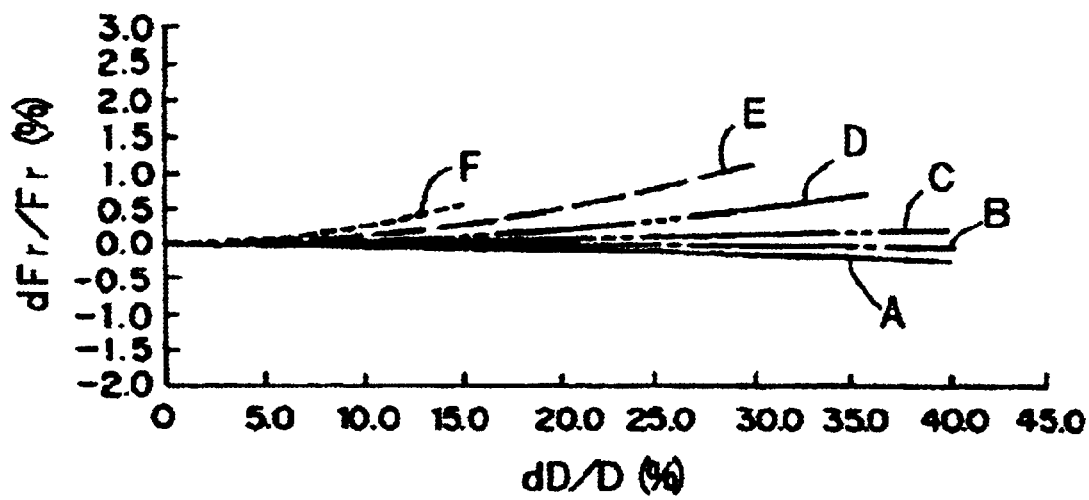
FIG. 13 is a diagram illustrating the relationship between the displacement of the internal electrodes and the rate of change of the resonant frequencies when the thicknesses of the outermost piezoelectric layers of a thickness extensional vibration mode piezoelectric resonator of parallel-connection type utilizing the second harmonic are varied.
Figure 14:
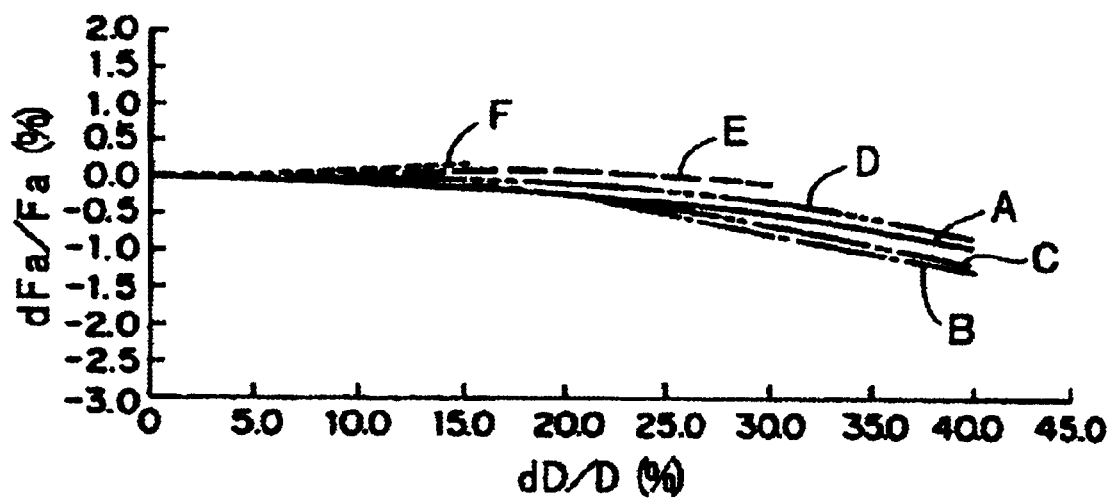
FIG. 14 is a diagram illustrating the relationship between the displacement of the internal electrodes and the rate of change of the antiresonant frequencies when the thicknesses of the outermost piezoelectric layers of a thickness extensional vibration mode piezoelectric resonator of parallel-connection type utilizing the second harmonic are varied.
Figure 15:
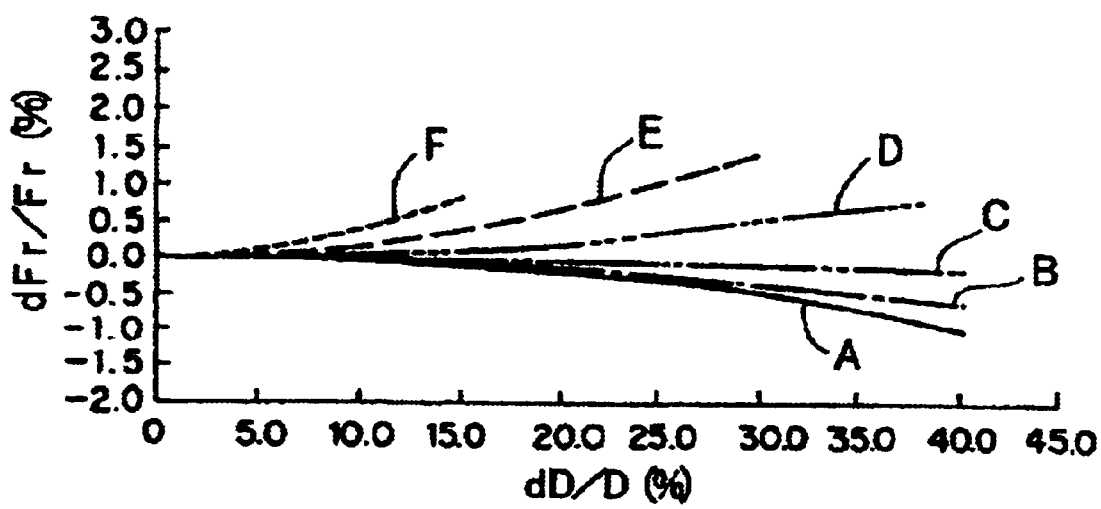
FIG. 15 is a diagram illustrating the relationship between the displacement of the internal electrodes and the rate of change of the resonant frequencies when the thicknesses of the outermost piezoelectric layers of a thickness extensional vibration mode piezoelectric resonator of parallel-connection type utilizing the third harmonic are varied.
Figure 16:
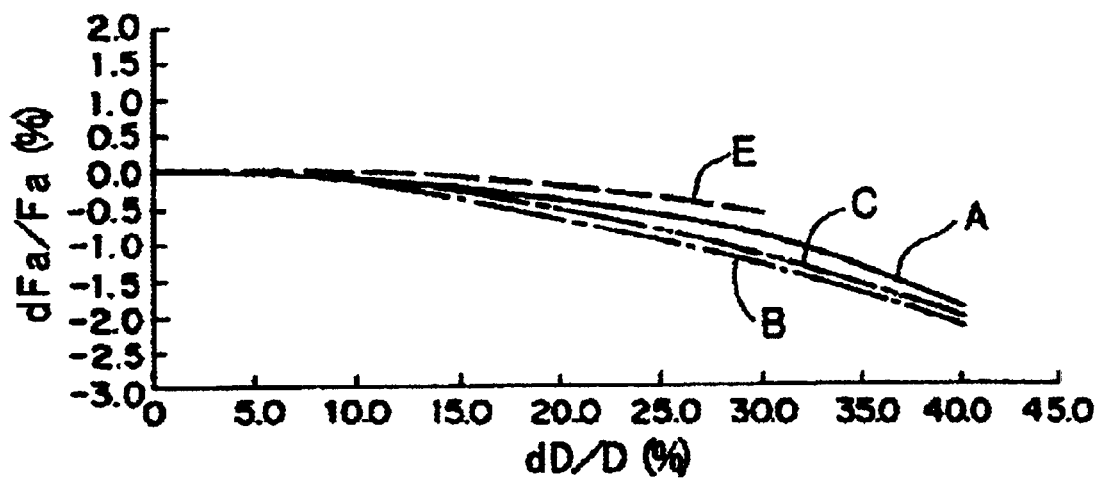
FIG. 16 is a diagram illustrating the relationship between the displacement of the internal electrodes and the rate of change of the antiresonant frequencies when the thicknesses of the outermost piezoelectric layers of a thickness extensional vibration mode piezoelectric resonator of parallel-connection type utilizing the third harmonic are varied.
Figure 17:
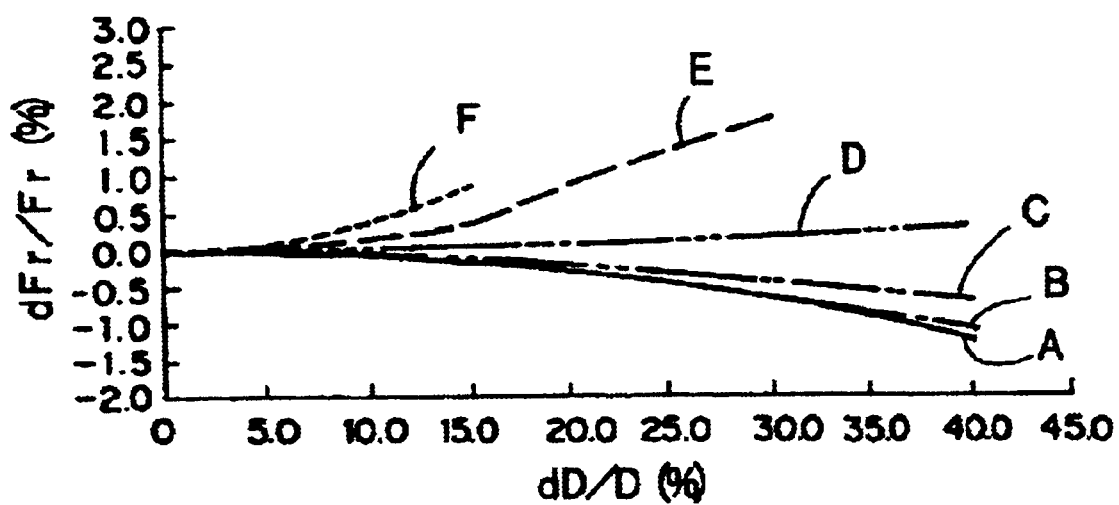
FIG. 17 is a diagram illustrating the relationship between the displacement of the internal electrodes and the rate of change of the resonant frequencies when the thicknesses of the outermost piezoelectric layers of a thickness extensional vibration mode piezoelectric resonator of parallel-connection type utilizing the fourth harmonic are varied.
Figure 18:
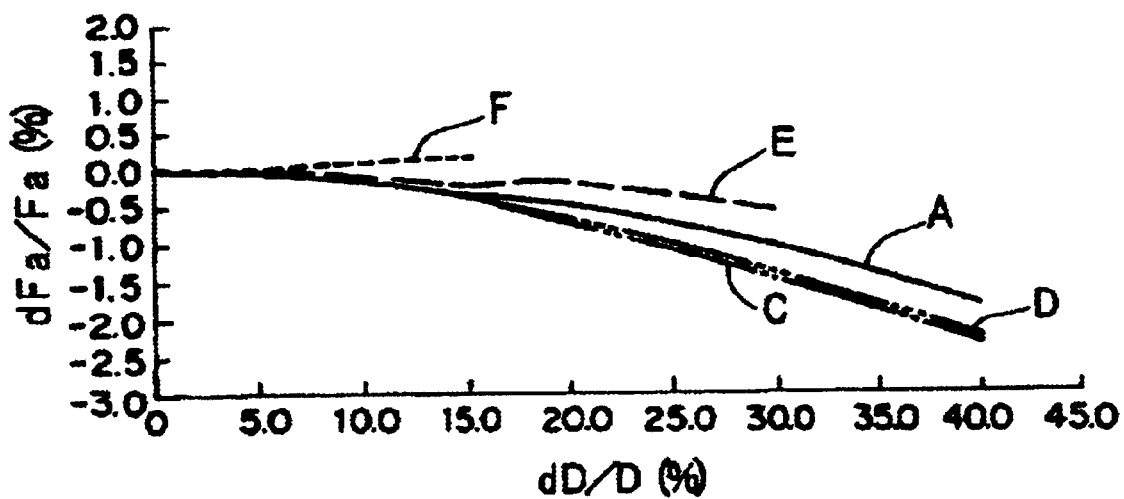
FIG. 18 is a diagram illustrating the relationship between the displacement of the internal electrodes and the rate of change of the antiresonant frequencies when the thicknesses of the outermost piezoelectric layers of a thickness extensional vibration mode piezoelectric resonator of parallel-connection type utilizing the fourth harmonic are varied.

FIGS. 13 and 14 show the result of the thickness extensional vibration mode piezoelectric resonator 11 utilizing the second harmonic, FIGS. 15 and 16 show the result of the thickness extensional vibration mode piezoelectric resonator 1 utilizing the third harmonic, and FIGS. 17 and 18 show the result of the thickness extensional vibration mode piezoelectric resonator 21 utilizing the fourth harmonic.

In FIG. 13, the horizontal axis denotes the ratio (percentage) of displacement dD in the direction of thickness of the internal electrodes to the thickness D of one piezoelectric layer sandwiched between internal electrodes. dD corresponds to the displacement of the internal electrodes shown in FIG. 6. The vertical axis of FIG. 13 denotes the ratio (percentage) of the amount of change $dF_r$ of the resonant frequency to the resonant frequency $F_r$. When the ideal frequency is represented by $F_r$, the rate of change of the resonant frequency is defined by actual measurement–$F_r$=$dF_r$.

The horizontal axis of FIG. 14 is the same as in FIG. 13, and the vertical axis denotes the ratio (percentage) of the amount of change $dF_a$ ($dF_a$=actual measurement of the antiresonant frequency–$F_a$) of the antiresonant frequency to the antiresonant frequency $F_a$.

In FIGS. 13 and 14, the solid line A shows the result in the case of D'/D=1.2, one-dot chain line B shows the result in the case of D'/D=1.0, two-dot chain line C shows the result in the case of D'/D=0.8, three-dot chain line D shows the result in the case of D'/D=0.6, broken line E shows the result in the case of D'/D=0.4, and broken line F shows the result in the case of D'/D=0.2.

Figure 19:
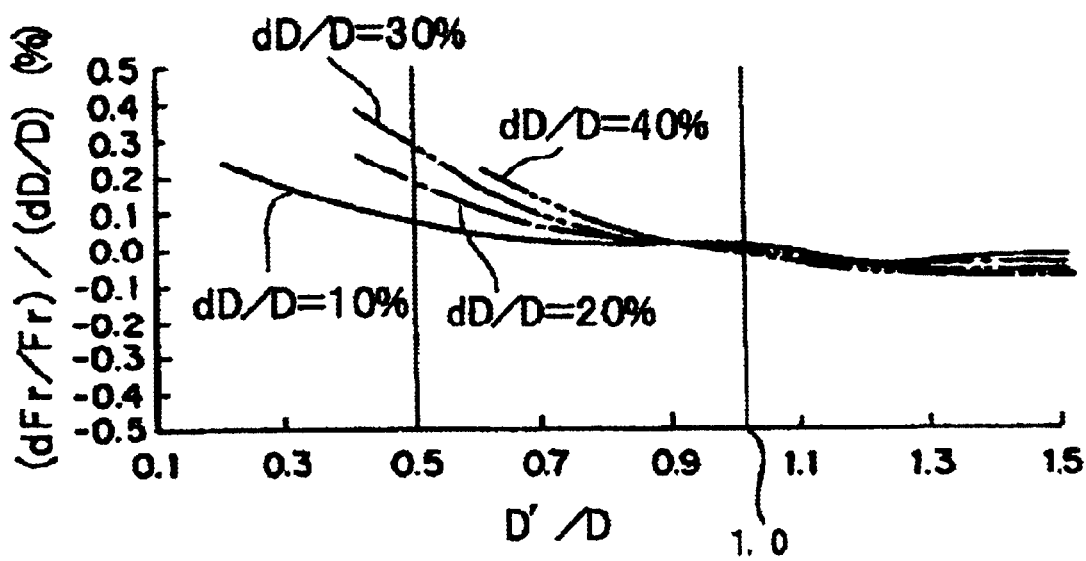
FIG. 19 is a diagram of the result shown in FIG. 13, illustrating the relationship between the thicknesses of the outermost piezoelectric layers and the rate of change of the resonant frequencies.
Figure 20:
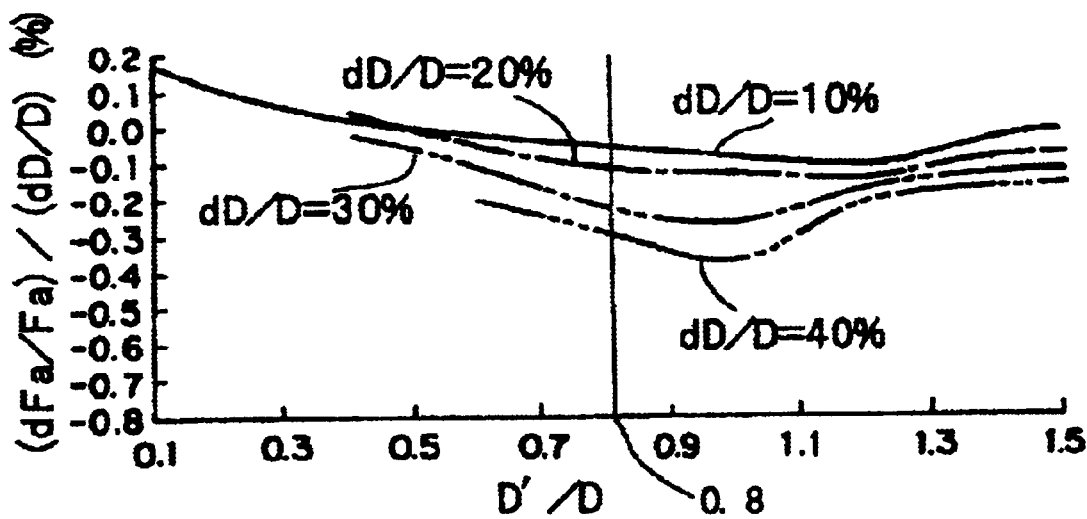
FIG. 20 is a diagram of the result shown in FIG. 14, illustrating the relationship between the thicknesses of the outermost piezoelectric layers and the rate of change of the antiresonant frequencies.

In FIGS. 19 and 20, the results of FIGS. 13 and 14 were modified so that the horizontal axis denotes the ratio (D'/D) of the thicknesses D' of the first and second piezoelectric layer 2c and 2d as the outermost layers to the thickness D.

In FIGS. 19 and 20, the rate of change of the resonant frequencies or antiresonant frequencies of the vertical axes is normalized to dD/D.

As clearly seen in FIGS. 19 and 20, the rate of change of the resonant frequencies and the rate of change of the antiresonant frequencies are greatly reduced by choosing the thicknesses D' of the first and second piezoelectric layer 2c and 2d as the outermost layers properly. In the ladder-type filters, the resonant frequency $F_r$ of the series-arm resonator and the antiresonant frequency $F_a$ of the parallel-arm resonator correspond with each other, and the corresponding frequency is a center frequency. Therefore, in order to increase the accuracy of the frequency of a ladder-type filter, it is preferable to set the resonant frequency $F_r$ of the series-arm resonator and the antiresonant frequency $F_a$ of the parallel-arm resonator with precision. Further, the initial crossover of the center frequency of the ladder-type filter is required to have an accuracy in the range of about ±0.3%.

Accordingly, when a thickness extensional vibration mode piezoelectric resonator 11 utilizing the second harmonic is used as a series-arm resonator, as clearly understood in FIG. 19, in order to make the rate of change of the resonant frequency in the range of about ±0.3%, it is sufficient to set D'/D or $(D_1+D_2)/2D$ at about 0.50 or more. In the same way, when a thickness extensional vibration mode piezoelectric resonator 11 is used as a parallel-arm resonator, to make the rate of change of the antiresonant frequency in the range of about ±0.2%, it is sufficient to set D'/D or $(D_1+D_2)/2D$ at 0.10 to 0.80.

But in a thickness extensional vibration mode piezoelectric resonator constituting a series-arm resonator, as shown in the formula (2A) the upper limit of D'/D is about 1.0. The reason is explained with reference to FIG. 25.

Figure 25:
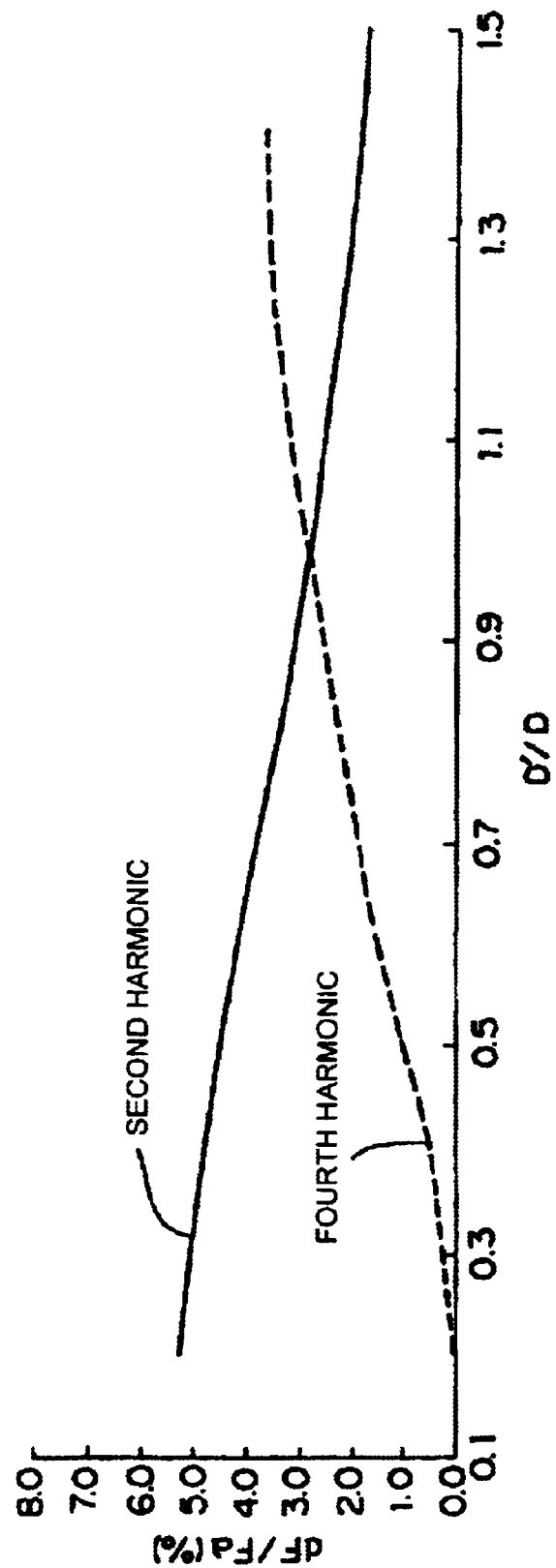
FIG. 25 is a diagram illustrating the relative bandwidth of the second harmonic and the relative bandwidth of a spurious mode in a thickness extensional vibration mode piezoelectric resonator of parallel-connection type utilizing the second harmonic.

FIG. 25 shows the relationship between the ratio (D'/D) of the thicknesses D' to the thickness D and the relative bandwidth dF/F. The vertical axis in FIG. 25 denotes relative bandwidth dF/F(%). The solid line shows the characteristics of the second harmonic as a vibration mode to be utilized, and the broken line shows the characteristics of the fourth harmonic as a spurious vibration. As clearly understood from FIG. 25, when D'/D exceeds about 1.0, the relative bandwidth of the fourth harmonic becomes larger than that of the second harmonic, and then the filter does not function. Therefore, D'/D or $(D_1+D_2)/2D$ is required to be about 1.0 or less. Accordingly, when a thickness extensional vibration mode piezoelectric resonator 11 is used as a series-arm resonator, as shown by the formula (2A), $(D_1+D_2)/2D$ is required to be in the range of about 0.50 to about 1.00.

Figure 21:
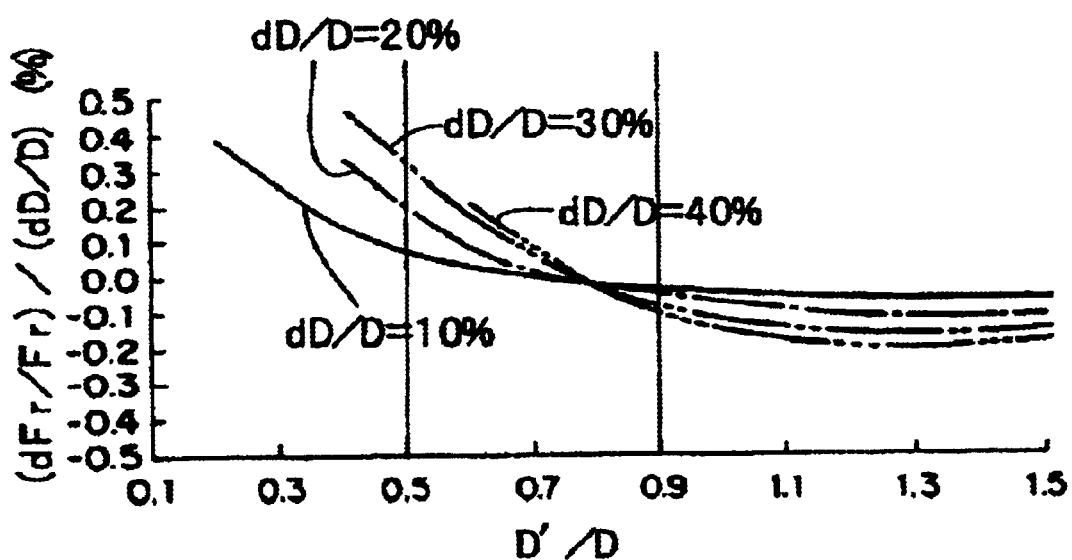
FIG. 21 is a diagram of the result shown in FIG. 15, illustrating the relationship between the thicknesses of the outermost piezoelectric layers and the rate of change of the resonant frequencies.
Figure 22:
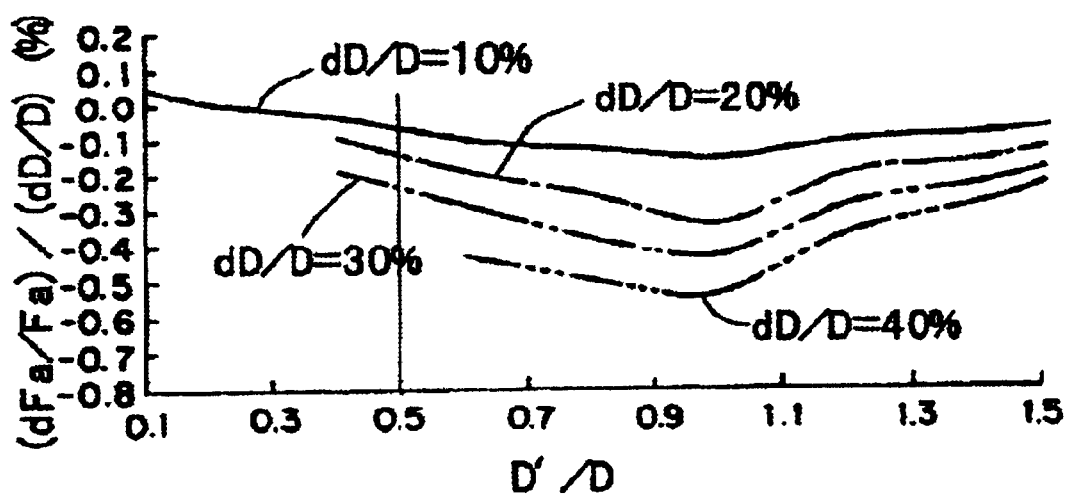
FIG. 22 is a diagram of the result shown in FIG. 16, illustrating the relationship between the thicknesses of the outermost piezoelectric layers and the rate of change of the antiresonant frequencies.

In a thickness extensional vibration mode piezoelectric resonator 1 utilizing the third harmonic, when the thicknesses of a first and second piezoelectric layer are variously changed, the results are shown in FIGS. 15 and 16. In FIGS. 15 and 16, the solid line A, one-dot chain line B, two-dot chain line C, three-dot chain line D, broken line E, and broken line F correspond to approximate values of 1.2, 1.0, 0.8, 0.6. 0.4, and 0.2 of D'/D, respectively. In FIGS. 21 and 22, the results of FIGS. 15 and 16 are rewritten, and these are equivalent to FIGS. 19 and 20 of a thickness extensional vibration mode piezoelectric resonator of the second harmonic.

Figure 23:
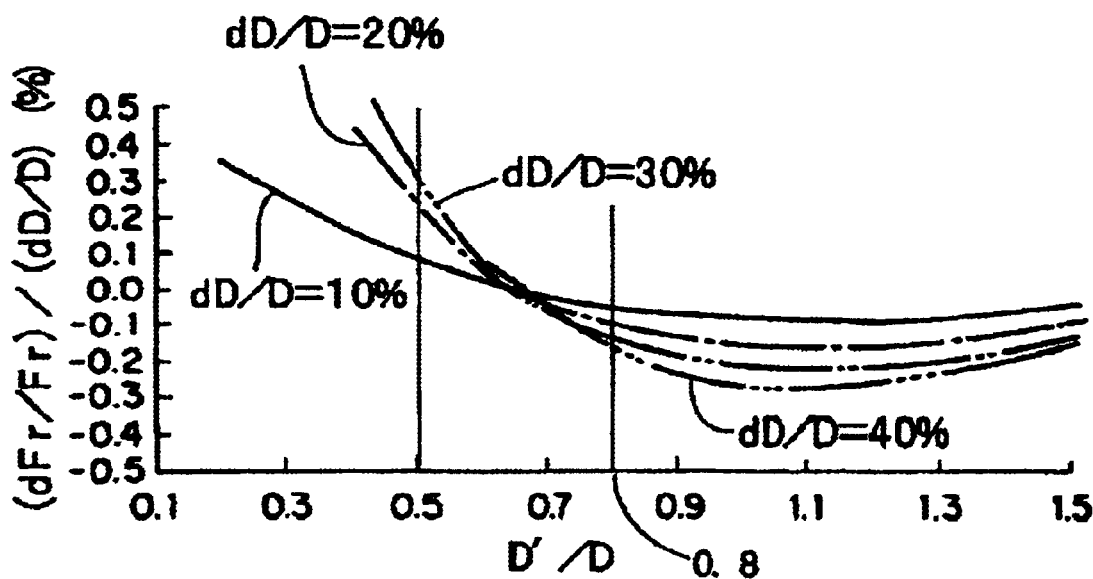
FIG. 23 is a diagram of the result shown in FIG. 17, illustrating the relationship between the thicknesses of the outermost piezoelectric layers and the rate of change of the resonant frequencies.
Figure 24:
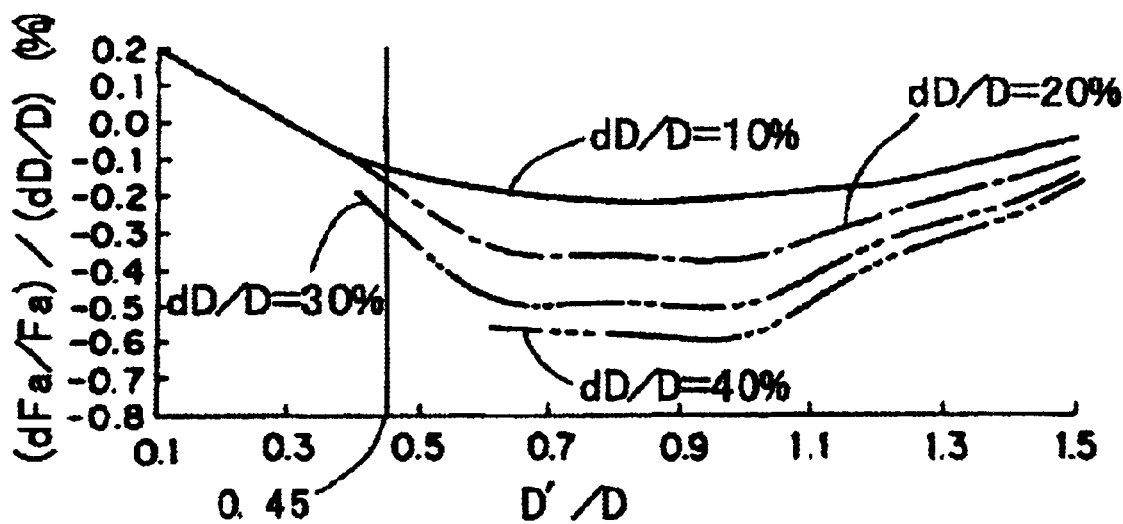
FIG. 24 is a diagram of the result shown in FIG. 18, illustrating the relationship between the thicknesses of the outermost piezoelectric layers and the rate of change of the antiresonant frequencies.

In a thickness extensional vibration mode piezoelectric resonator 21 utilizing the fourth harmonic, when the thicknesses of a first and second piezoelectric layer are variously changed, the results are shown in FIGS. 17 and 18. In FIGS. 17 and 18, the solid line A, one-dot chain line B, two-dot chain line C, three-dot chain line D, broken line E, and broken line F correspond to approximate values of 1.2, 1.0, 0.8, 0.6, 0.4, and 0.2 of D'/D, respectively. In FIGS. 23 and 24, the results of FIGS. 17 and 18 are modified, and these are equivalent to FIGS. 19 and 20 of a thickness extensional vibration mode piezoelectric resonator of the second harmonic.

As clearly understood from FIGS. 21 and 23, when the thickness extensional vibration mode piezoelectric resonators 1 and 21 utilizing the third and fourth harmonic are used as a series-arm resonator, if the thicknesses of a first and second piezoelectric layer 2c and 2d as the outermost layers are controlled so that $(D_1+D_2)/2D$ is about 0.50 or more, the resonance frequency is in the range of about ±0.3%.

In the formulas (1A) and (3A), the upper limit of $(D_1+D_2)/2D$ is preferably about 0.90 and about 0.80, respectively. The reason is explained with reference to FIGS. 26 and 27.

Figure 26:
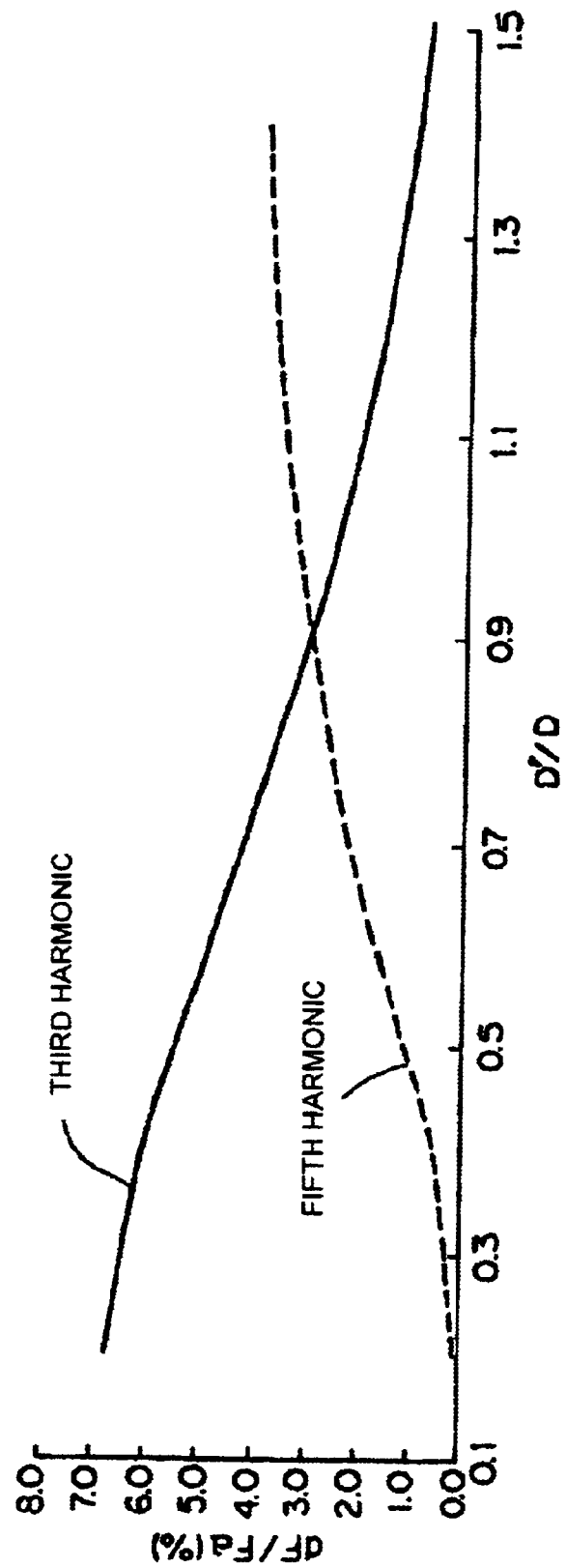
FIG. 26 is a diagram illustrating the relative bandwidth of the third harmonic and the relative bandwidth of a spurious mode in a thickness extensional vibration mode piezoelectric resonator of parallel-connection type utilizing the third harmonic.
Figure 27:
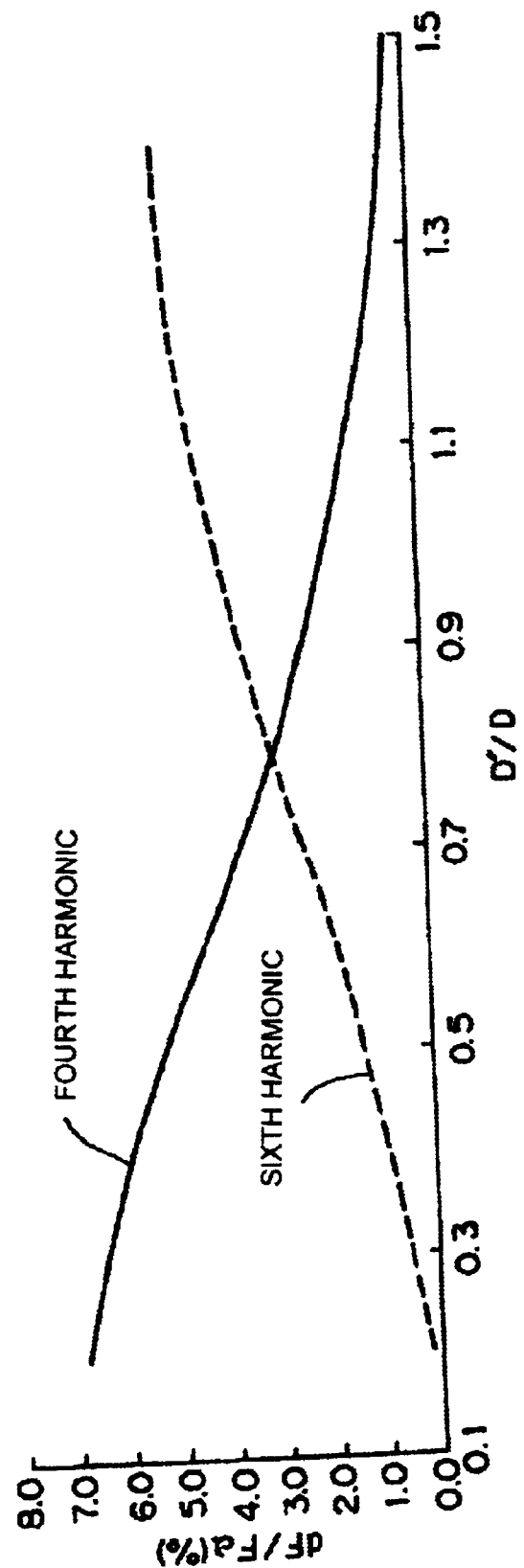
FIG. 27 is a diagram illustrating the relative bandwidth of the fourth harmonic and the relative bandwidth of a spurious mode in a thickness extensional vibration mode piezoelectric resonator of parallel-connection type utilizing the fourth harmonic.

As in FIG. 25, FIGS. 2.6 and 27 show the relationship between $(D_1+D_2)/2D$ or D'/D and the relative bandwidth $dF/dF_a$. In FIGS. 26 and 27, the solid line shows the characteristics of the third and fourth harmonic, and the broken line shows the fifth and sixth harmonic as a spurious vibration, respectively. As clearly understood from FIGS. 26 and 27, in the thickness extensional vibration mode piezoelectric resonators 1 and 21, when D'/D or $(D_1+D_2)/2D$ exceeds about 0.90 and about 0.80, the relative bandwidth of spurious vibrations becomes larger. Therefore, in the formulas (1A) and (3A), the upper limit of $(D_1+D_2)/2D$ of the thickness extensional vibration mode piezoelectric resonators 1 and 21 utilizing the third and fourth harmonic is made about 0.90 and about 0.80, respectively.

As clearly understood from FIGS. 22 and 24, when the thickness extensional vibration mode piezoelectric resonators 1 and 21 utilizing the third and fourth harmonic are used as a parallel-arm resonator, by setting dD/D or $(D_1+D_2)/2D$ at about 0.10 to about 0.50 and about 0.10 to about 0.45 as shown in the formulas (1B) and (3B), respectively, the antiresonant frequency can be made in the range of about ±0.3%.

In high-frequency applications, the thickness D of one piezoelectric layer sandwiched between internal electrodes decreases. Therefore, when the processing conditions are the same, the ratio dD/D increases and the frequency accuracy deteriorates. However, by setting the thicknesses of the outermost piezoelectric layers 2c and 2d in the above-mentioned particular range in accordance with the present preferred embodiments, the adverse effect of the displacement of internal electrodes on the change of resonant frequencies and antiresonant frequencies is minimized.

Figure 9:
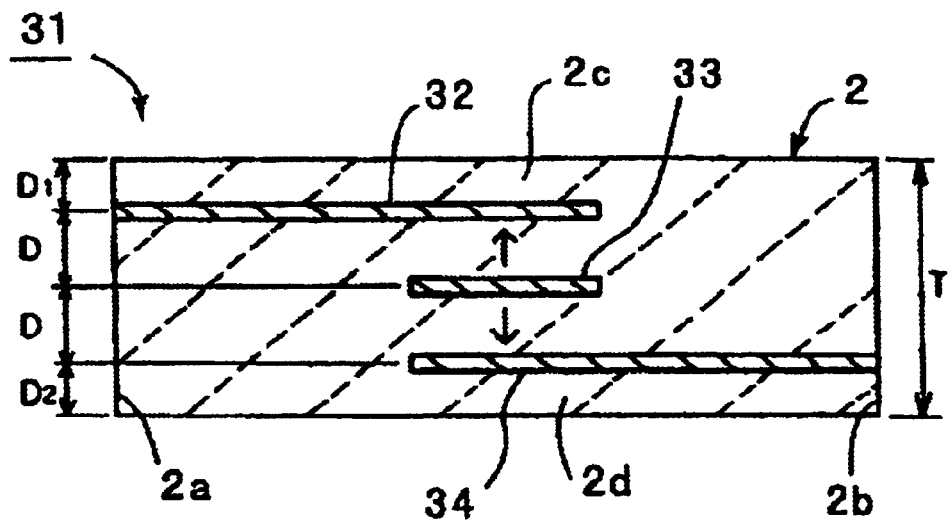
FIG. 9 is a sectional view illustrating a thickness extensional vibration mode piezoelectric resonator of a series-connection type utilizing the second harmonic according to a fifth preferred embodiment of the present invention.
Figure 10:
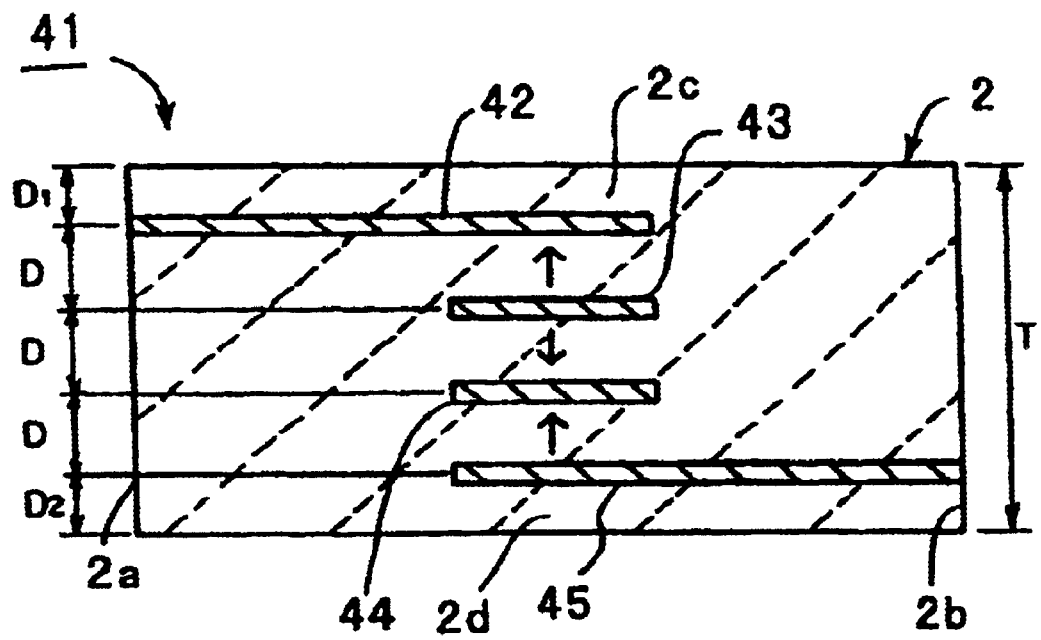
FIG. 10 is a sectional view illustrating a thickness extensional vibration mode piezoelectric resonator of a series-connection type utilizing the third harmonic according to a sixth preferred embodiment of the present invention.
Figure 11:
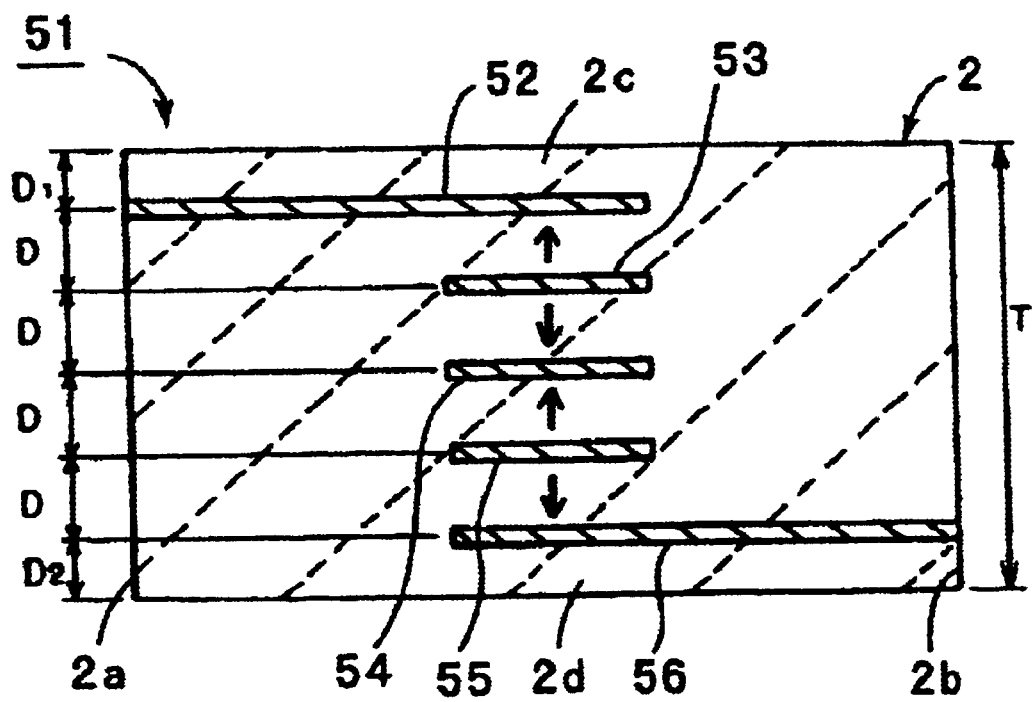
FIG. 11 is a sectional view illustrating a thickness extensional vibration mode piezoelectric resonator of series-connection type utilizing the forth harmonic according to a seventh preferred embodiment of the present invention.
Figure 12:
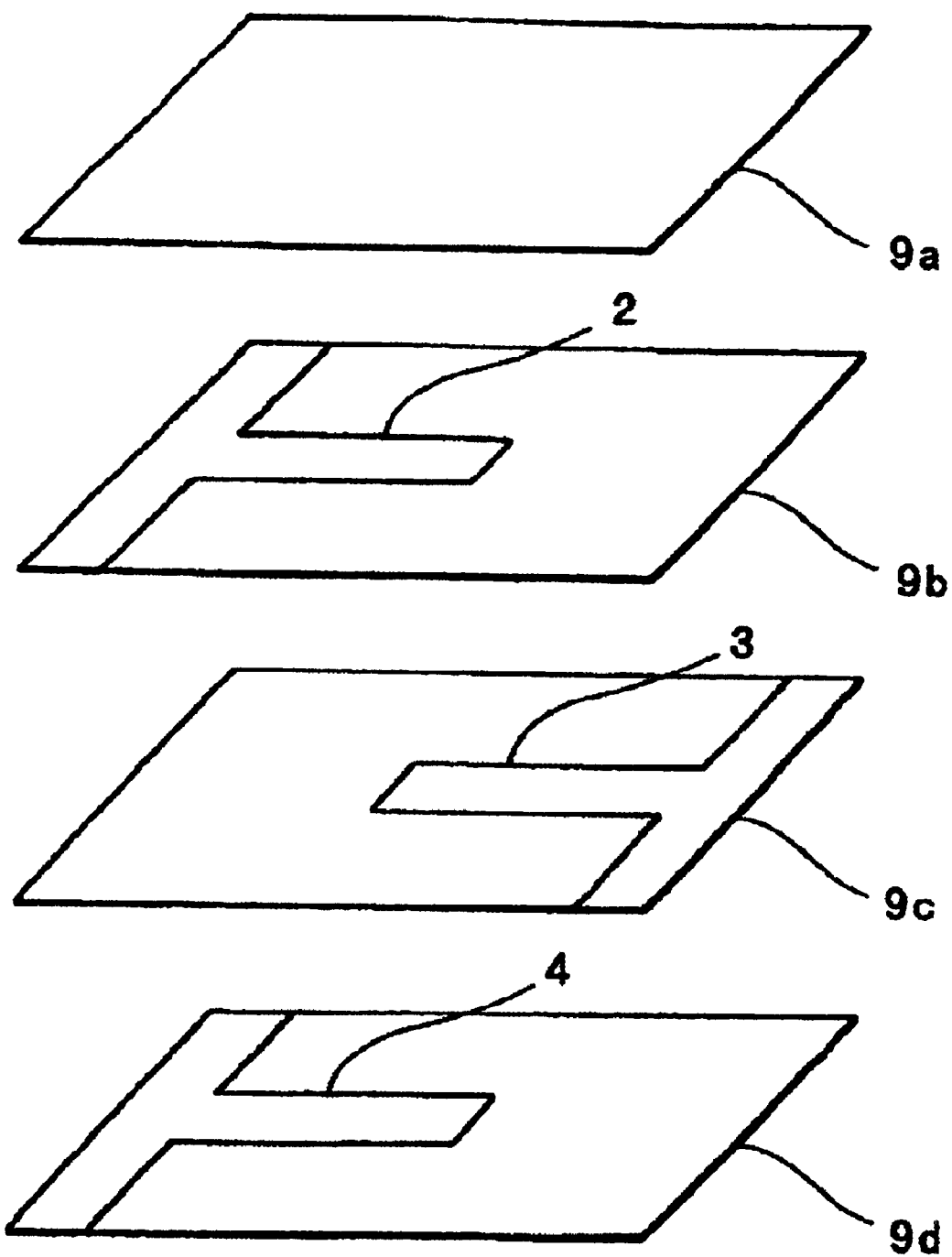
FIG. 12 is an exploded perspective view illustrating another example of the configuration of internal electrodes in a thickness extensional vibration mode piezoelectric resonator according to a preferred embodiment of the present invention.

In the above-described preferred embodiments, the thickness extensional vibration mode piezoelectric resonators 1, 11, and 21 of parallel-connection type as they are called were explained. But in the third and fourth preferred embodiments of the present invention, the thickness extensional vibration mode piezoelectric resonators of series-connection type are used. These are shown in FIGS. 9–11. In FIGS. 9–11, although the external electrodes are not illustrated, a pair of external electrodes are arranged so as to cover the end surfaces 2a and 2b of the piezoelectric body 2 in the same way as the external electrodes 7 and 8 in FIG. 4B.

In a thickness extensional vibration mode piezoelectric resonator 31 shown in FIG. 9, three internal electrodes 32–34 are arranged inside of a piezoelectric body 2 so as to be stacked on each other with piezoelectric layers disposed therebetween. The middle internal electrode 33 is an electrode that is a no connection type. The internal electrode 32 is extended to one end surface 2a of the piezoelectric body 2, and the internal electrode 34 is extended to the other end surface 2b of the piezoelectric body 2 on the opposite side to the end surface 2a. In the piezoelectric body 2, the piezoelectric layer between the internal electrode 32 and internal electrode 33 and the piezoelectric layer between the internal electrode 33 and internal electrode 34 are polarized in opposite directions in the direction of thickness.

Therefore, when a pair of external electrodes are disposed on the surfaces 2a and 2b so as to be electrically connected to the internal electrodes 32 and 34 and an AC electric field is applied to the external electrodes; the piezoelectric resonator 31 functions as a thickness extensional vibration mode piezoelectric resonator utilizing the second harmonic.

Similarly, in a thickness extensional vibration mode piezoelectric resonator 41 according to a sixth preferred embodiment shown in FIG. 10, four internal electrodes 42–45 are provided in a piezoelectric body 2. When an AC voltage is applied between the internal electrodes 42 and 45, the piezoelectric resonator 41 functions as a thickness extensional vibration mode piezoelectric resonator of series-arm connection type utilizing the third harmonic.

In a thickness extensional vibration mode piezoelectric resonator 51 according to a seventh preferred embodiment shown in FIG. 11, five internal electrodes 52–56 are disposed in a piezoelectric body 2 so as to be stacked on each other with piezoelectric layers disposed therebetween. By applying an AC voltage between the internal electrodes 52 and 56, the piezoelectric resonator 51 functions as a thickness extensional vibration mode piezoelectric resonator utilizing the fourth harmonic of a thickness extensional vibration mode.

In the above-described thickness extensional vibration mode piezoelectric resonators 31–51 of series-connection type, in the same way as in the cases of parallel-connection type, by setting the thicknesses of the outermost piezoelectric layers 2c and 2d so as to meet the following formulas (4A)–(6A), respectively, variations of the resonant frequencies are minimized and the (N+1)th mode vibration as a spurious vibration are effectively suppressed in the same way as in the thickness extensional vibration mode piezoelectric resonators of parallel-connection type.

$$0.60 \leq (D_1+D_2)/2D \leq 1.10 \quad (4A)$$

$$0.65 \leq (D_1+D_2)/2D \leq 0.90 \quad (5A)$$

$$0.60 \leq (D_1+D_2)/2D \leq 0.80 \quad (6A)$$

Further, in the thickness extensional vibration mode piezoelectric resonators 31–51 of series-connection type, in the same way as in the cases of parallel-connection type, by setting the thicknesses of the outermost piezoelectric layers 2c and 2d meeting the following formulas (4B)–(6B), respectively, variations of the antiresonant frequencies are effectively reduced and the (N+1)th mode vibration as a spurious vibration are effectively suppressed.

$$0.10 \leq (D_1+D_2)/2D \leq 1.10 \quad (4B)$$

$$0.10 \leq (D_1+D_2)/2D \leq 0.90 \quad (5B)$$

$$0.10 \leq (D_1+D_2)/2D \leq 0.80 \quad (6B)$$

It is explained that by constructing thickness extensional vibration mode piezoelectric resonators so as to meet the formulas (4A)–(6B) with reference to FIGS. 28–42 variations of the resonant frequencies or antiresonant frequencies are minimized, and that a spurious mode of the (N+1)th mode is suppressed.

Figure 28:
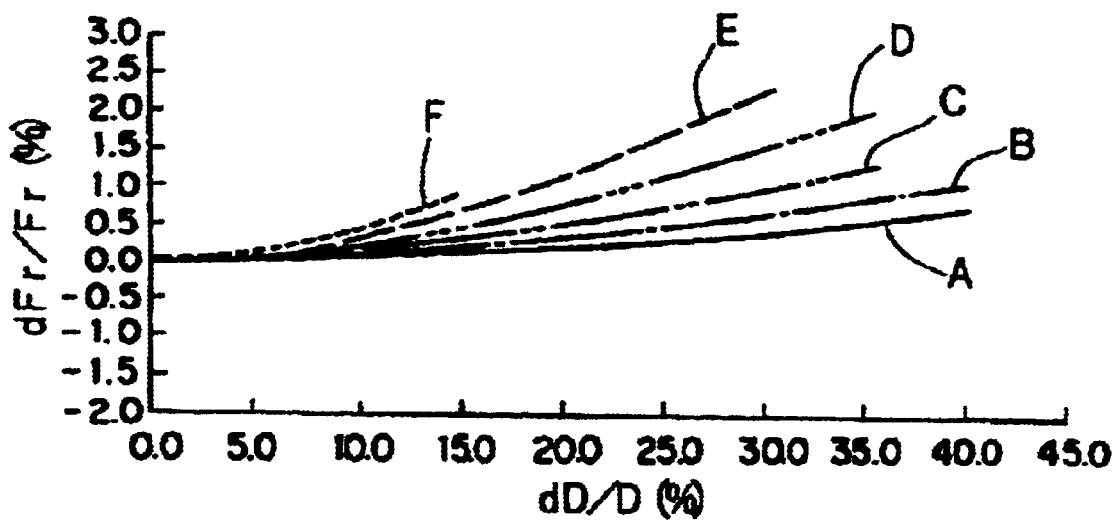
FIG. 28 is a diagram illustrating the relationship between the displacement of the internal electrodes and the rate of change of the resonant frequencies when the thicknesses of the outermost piezoelectric layers are changed in a thickness extensional vibration mode piezoelectric resonator of series-connection type utilizing the second harmonic.
Figure 30:
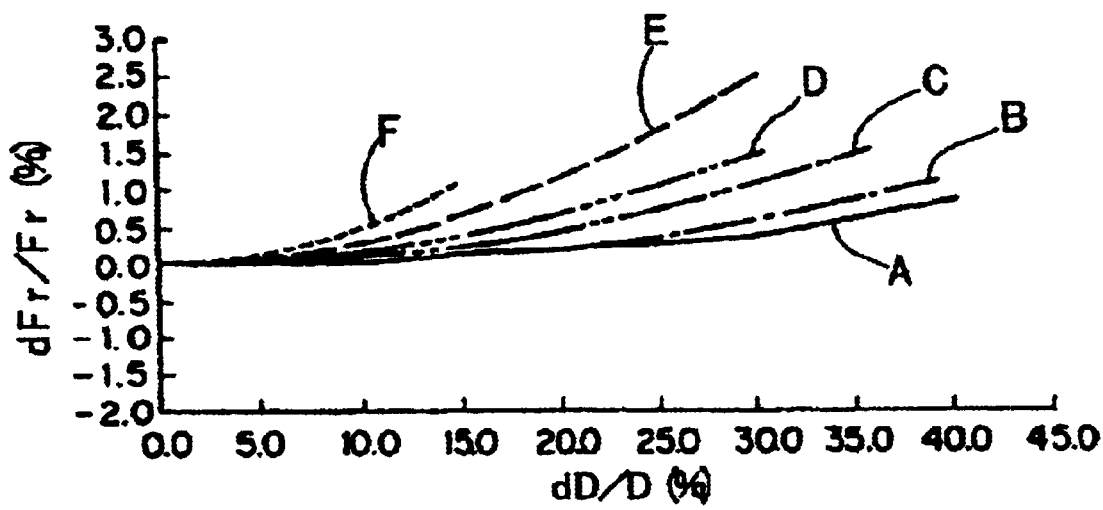
FIG. 30 is a diagram illustrating the relationship between the displacement of the internal electrodes and the rate of change of the resonant frequencies when the thicknesses of the outermost piezoelectric layers are changed in a thickness extensional vibration mode piezoelectric resonator of series-connection type utilizing the third harmonic.
Figure 32:
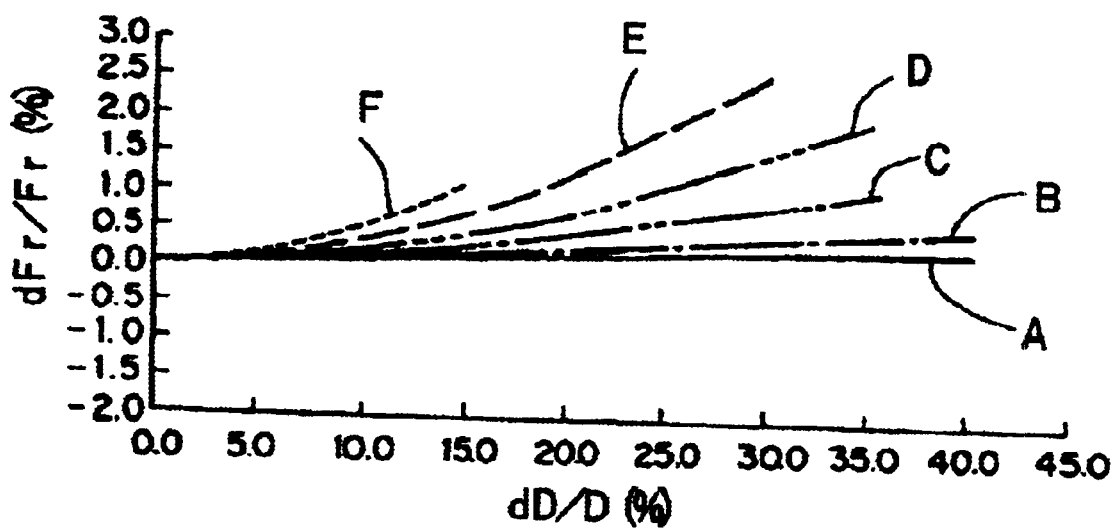
FIG. 32 is a diagram illustrating the relationship between the displacement of the internal electrodes and the rate of change of the resonant frequencies when the thicknesses of the outermost piezoelectric layers are changed in a thickness extensional vibration mode piezoelectric resonator of series-connection type utilizing the fourth harmonic.

FIGS. 28, 30, and 32 show the relationship between dD/D and the rate of change $dF_r/F_r$ of the resonant frequencies when D'/D or $(D_1+D_2)/2D$ of the thickness extensional vibration mode piezoelectric resonators 31–51 was changed, respectively, and these drawings correspond to FIG. 13 illustrating the thickness extensional vibration mode piezoelectric resonators of parallel-connection type utilizing the second harmonic.

Figure 29:
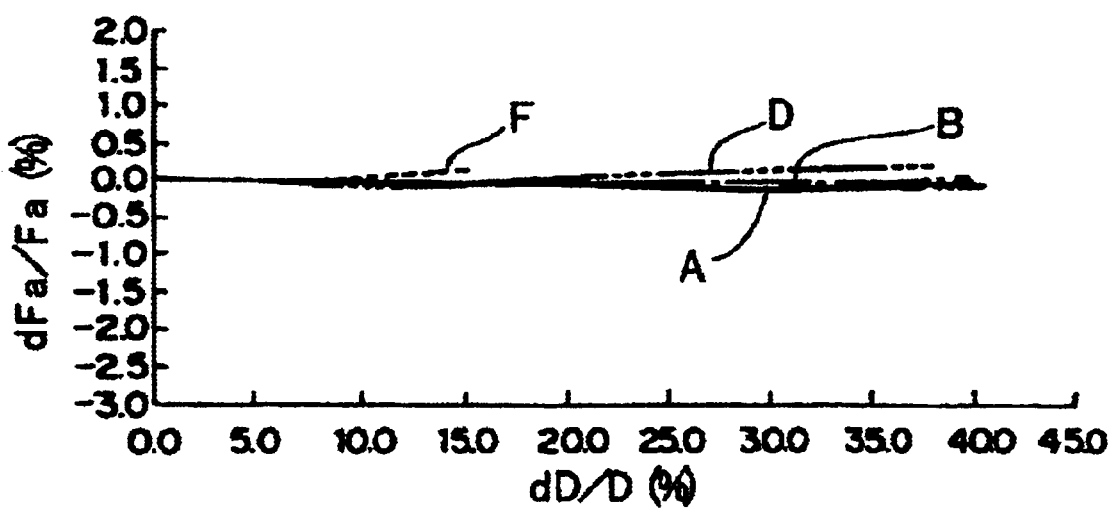
FIG. 29 is a diagram illustrating the relationship between the displacement of the internal electrodes and the rate of change of the antiresonant frequencies when the thicknesses of the outermost piezoelectric layers are changed in a thickness extensional vibration mode piezoelectric resonator of series-connection type utilizing the second harmonic.
Figure 31:
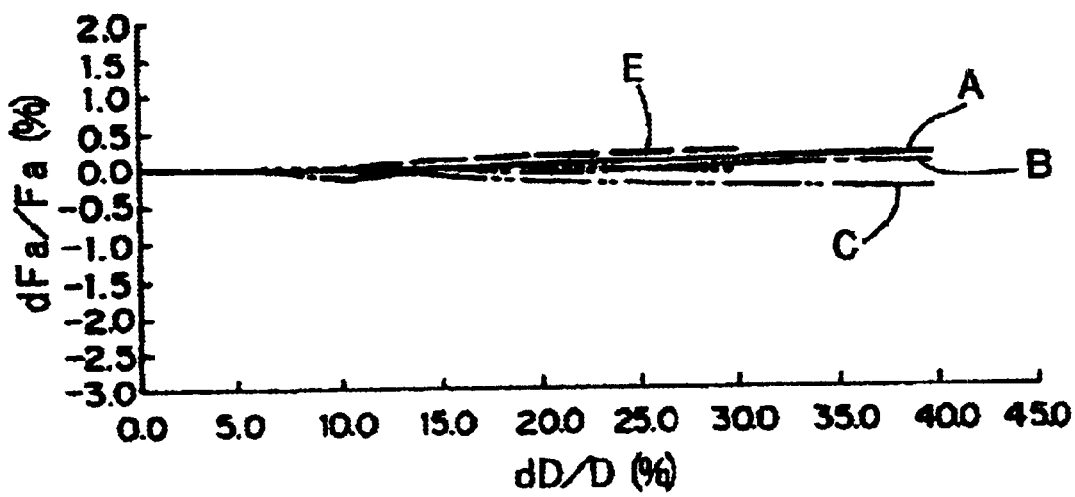
FIG. 31 is a diagram illustrating the relationship between the displacement of the internal electrodes and the rate of change of the antiresonant frequencies when the thicknesses of the outermost piezoelectric layers are changed in a thickness extensional vibration mode piezoelectric resonator of series-connection type utilizing the third harmonic.
Figure 33:
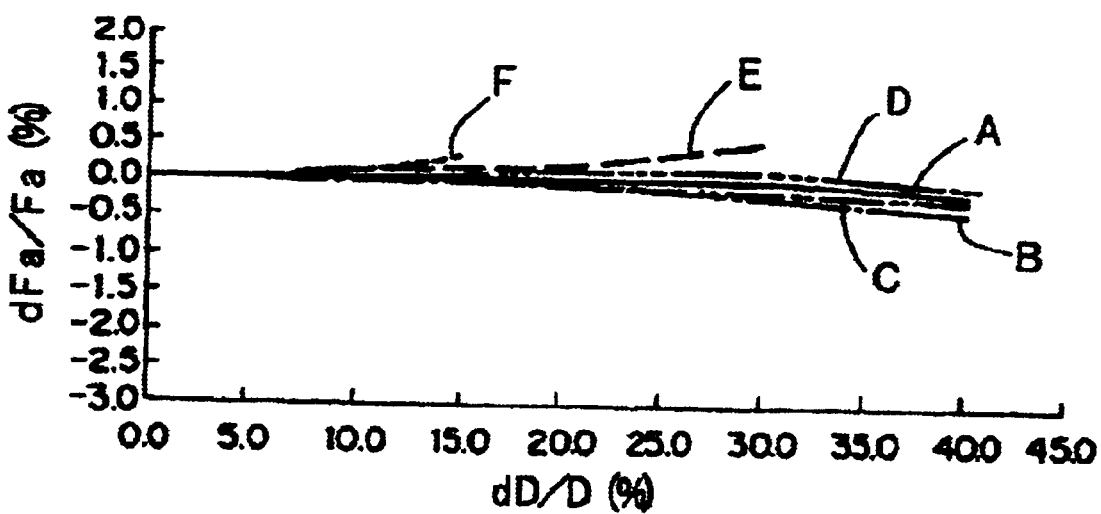
FIG. 33 is a diagram illustrating the relationship between the displacement of the internal electrodes and the rate of change of the antiresonant frequencies when the thicknesses of the outermost piezoelectric layers are changed in a thickness extensional vibration mode piezoelectric resonator of series-connection type utilizing the fourth harmonic.

FIGS. 29, 31, and 33 show the relationship between dD/D and the rate of change $dF_a/F_a$ of the antiresonant frequencies when D'/D of the thickness extensional vibration mode piezoelectric resonators 31–51 was changed, respectively, and these drawings correspond to FIG. 14 illustrating the thickness extensional vibration mode piezoelectric resonators of parallel-connection type utilizing the second harmonic.

In FIGS. 28–33, the solid line A, one-dot .chain line B, two-dot chain line C, three-dot chain line D, broken line E, and broken line F have the same meaning as in FIG. 13.

Figure 34:
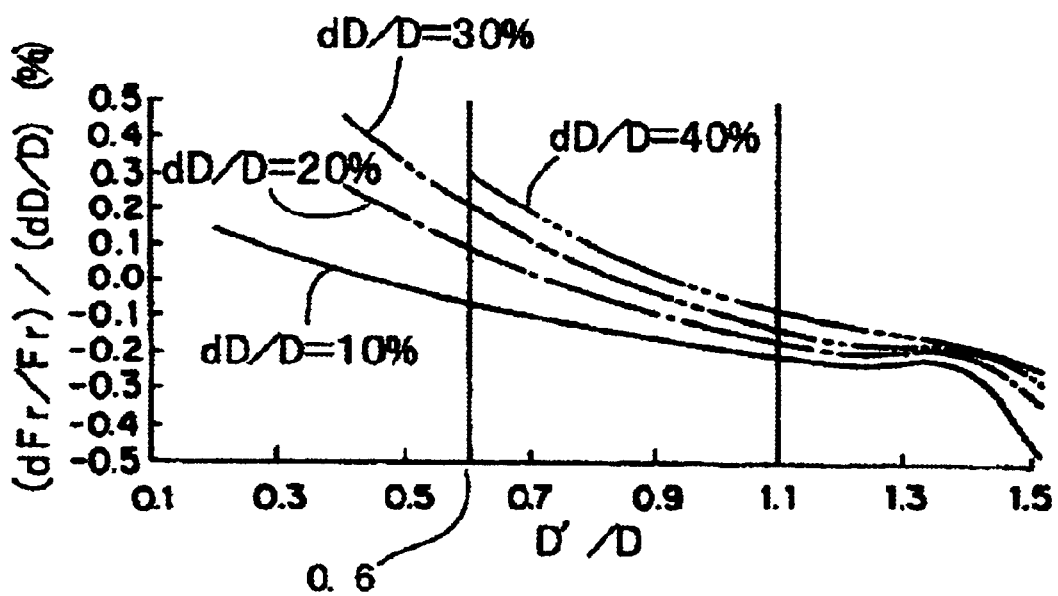
FIG. 34 is a diagram of the result shown in FIG. 28, illustrating the relationship between the thickenesses of the outermost piezoelectric layers and the rate of change of the resonant frequencies.
Figure 36:
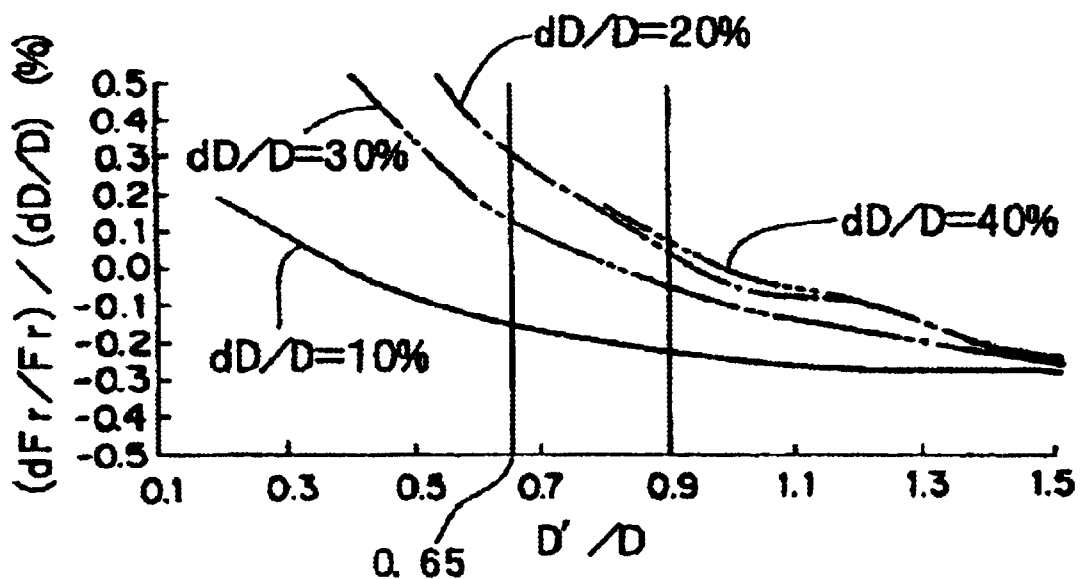
FIG. 36 is a diagram of the result shown in FIG. 30, illustrating the relationship between the thickenesses of the outermost piezoelectric layers and the rate of change of the resonant frequencies.
Figure 38:
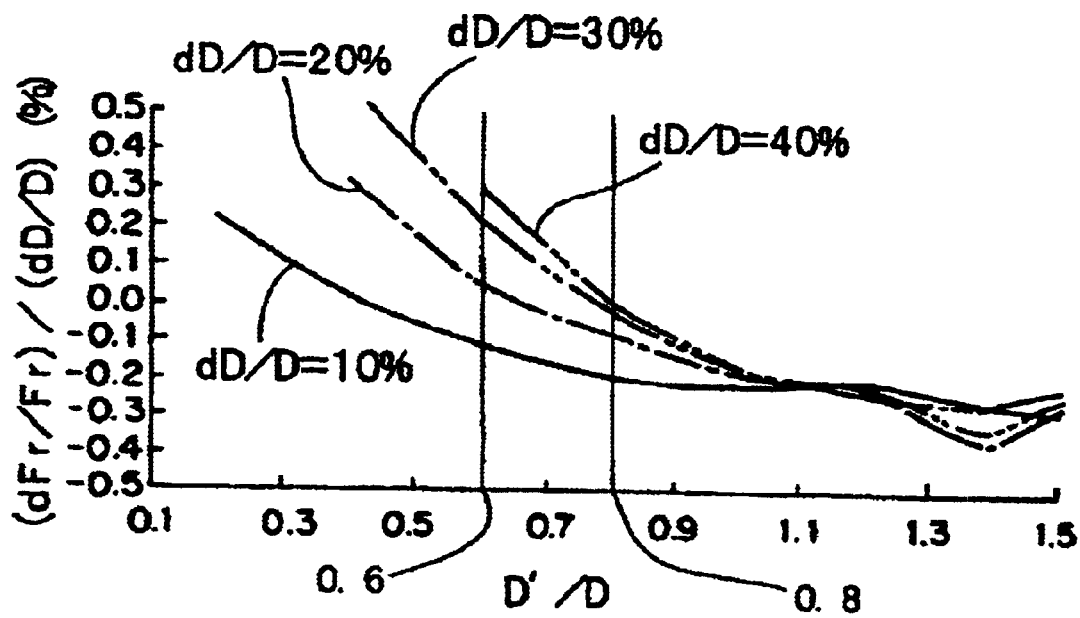
FIG. 38 is a diagram of the result shown in FIG. 32, illustrating the relationship between the thickenesses of the outermost piezoelectric layers and the rate of change of the resonant frequencies.

FIGS. 34, 36, 38 show the relationship between D'/D or $(D_1+D_2)/2D$ and the normalized rate of change of the resonant frequencies of each of the thickness extensional vibration mode piezoelectric resonators 31–51 of series-connection type utilizing the second harmonic, the third harmonic, and the fourth harmonic, respectively, and these drawings correspond to FIG. 19 concerning the thickness extensional vibration mode piezoelectric resonator of parallel-connection type utilizing the second harmonic.

Figure 35:
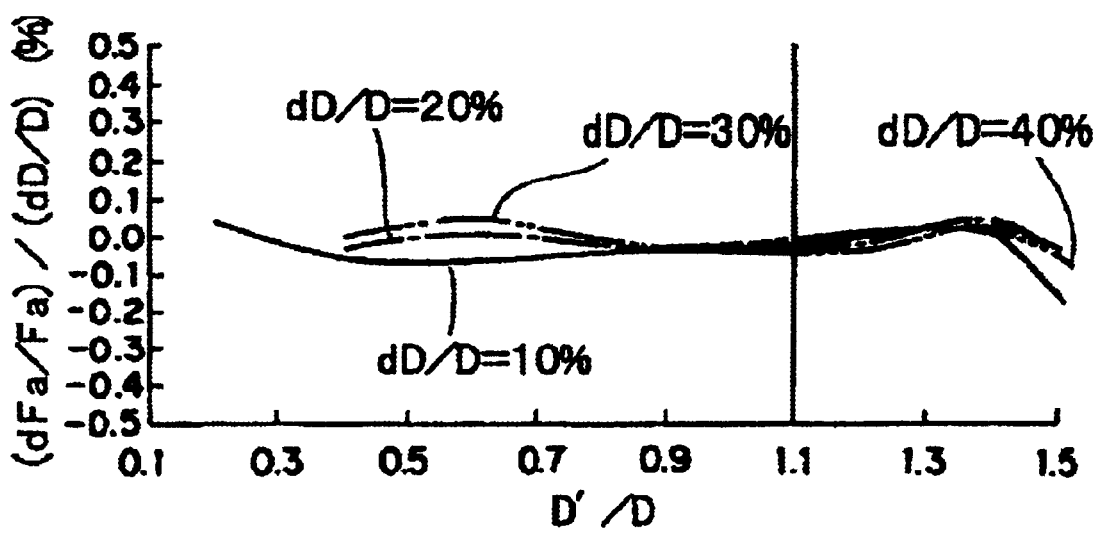
FIG. 35 is a diagram of the result shown in FIG. 29, illustrating the relationship between the thickenesses of the outermost piezoelectric layers and the rate of change of the antiresonant frequencies.
Figure 37:
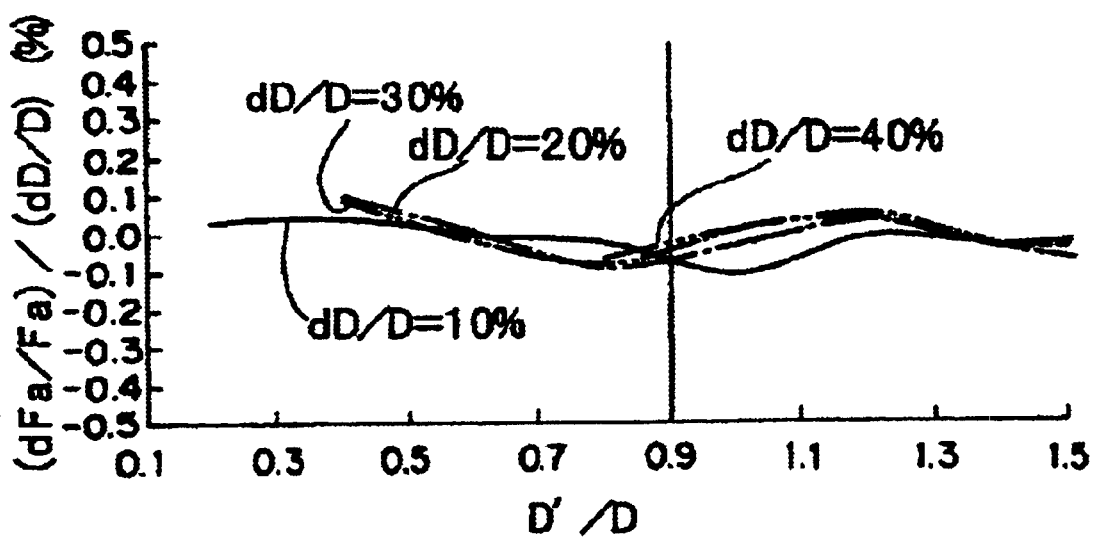
FIG. 37 is a diagram of the result shown in FIG. 31, illustrating the relationship between the thickenesses of the outermost piezoelectric layers and the rate of change of the antiresonant frequencies.
Figure 39:
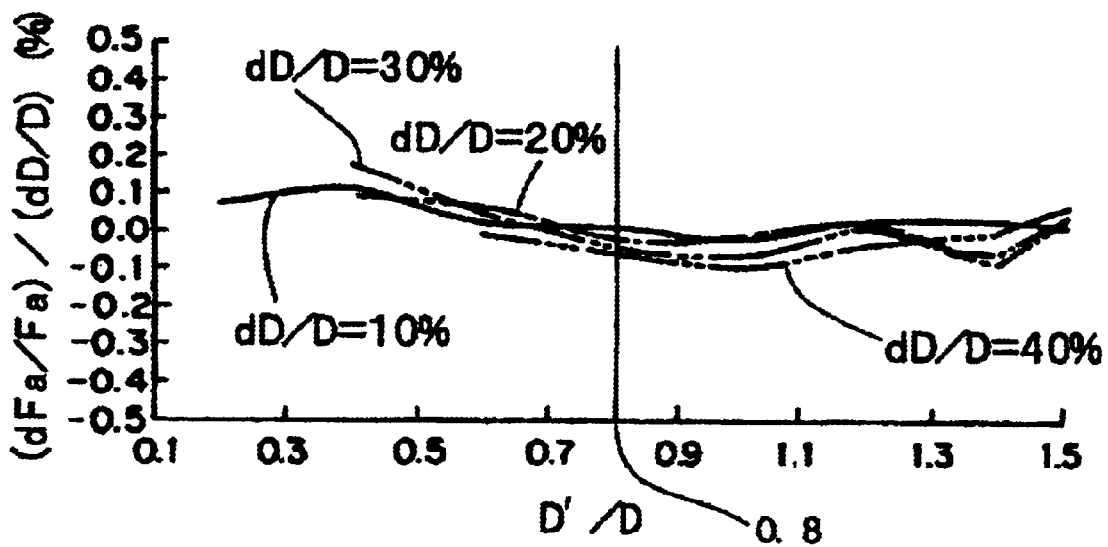
FIG. 39 is a diagram of the result shown in FIG. 33, illustrating the relationship between the thickenesses of the outermost piezoelectric layers and the rate of change of the antiresonant frequencies.

FIGS. 35, 37, 39 show the relationship between D'/D or $(D_1+D_2)/2D$ and the normalized rate of change of the antiresonant frequencies of each of the thickness extensional vibration mode piezoelectric resonators 31–51 of series-connection type utilizing the second harmonic, the third harmonic, and the fourth harmonic, respectively, and these drawings correspond to FIG. 20 concerning the thickness extensional vibration mode piezoelectric resonators of parallel-connection type utilizing the second harmonic.

As clearly understood from FIGS. 34, 36, and 38, in the thickness extensional vibration mode piezoelectric resonators 31–51, when D'/D or $(D_1+D_2)/2D$ is about 0.60, about 0.65, and about 0.60, or more, respectively, the rate of change of the resonant frequencies is in the range of about ±0.3%.

Figure 40:
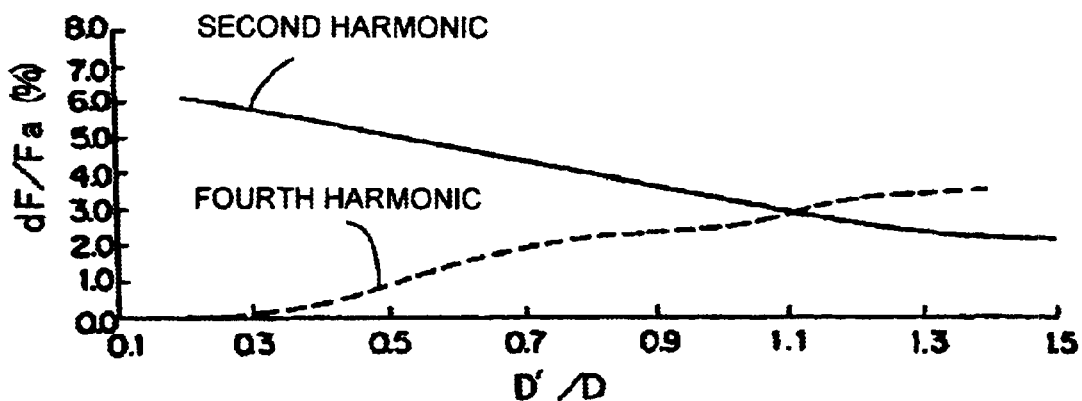
FIG. 40 is a diagram illustrating the relative bandwidth of the second harmonic and the relative bandwidth of a spurious mode in a thickness extensional vibration mode piezoelectric resonator of series-connection type utilizing the second harmonic.
Figure 41:
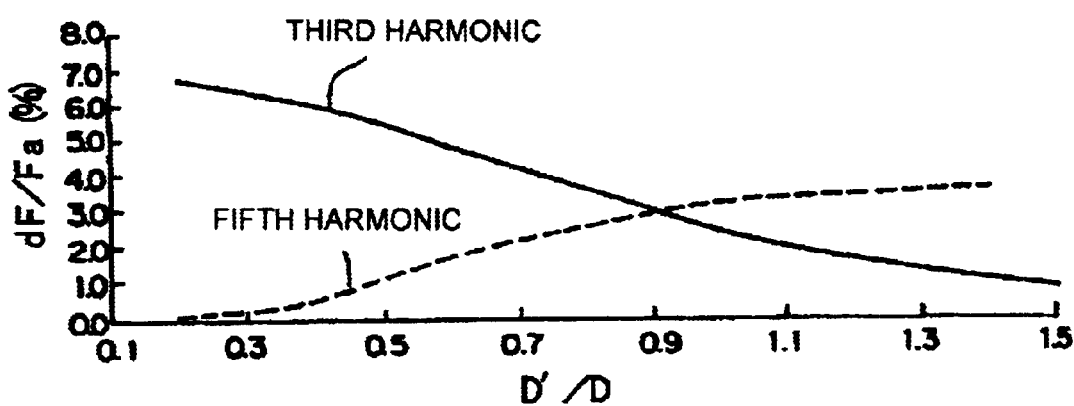
FIG. 41 is a diagram illustrating the relative bandwidth of the third harmonic and the relative bandwidth of a spurious mode in a thickness extensional vibration mode piezoelectric resonator of series-connection type utilizing the third harmonic.
Figure 42:
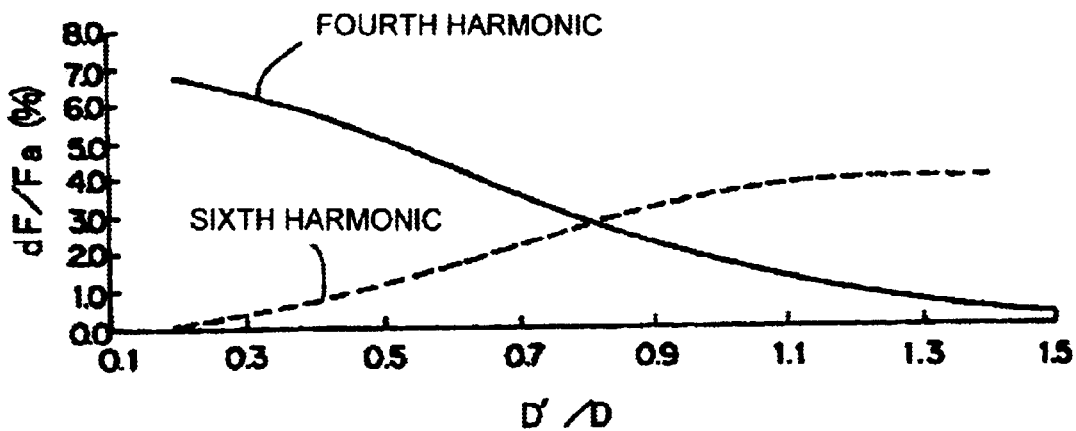
FIG. 42 is a diagram illustrating the relative bandwidth of the fourth harmonic and the relative bandwidth of a spurious mode in a thickness extensional vibration mode piezoelectric resonator of series-connection type utilizing the fourth harmonic.

FIGS. 40–42 show the relative bandwidth of the main mode and the relative bandwidth of the (N+1)th mode as a spurious mode. Accordingly, as clearly understood from FIGS. 40–42, in order to decrease the relative bandwidth of the (N+1)th mode as a spurious mode, it is sufficient to set the upper limit of D'/D or $(D_1+D_2)/2D$ of the thickness extensional vibration mode piezoelectric resonators 31–51 at about 1.10, about 0.90, and about 0.80, respectively.

Therefore, when the thickness extensional vibration mode piezoelectric resonators 31–51 are used as a series-arm resonator of a ladder-type filter, by controlling $(D_1+D_2)/2D$ so as to meet the formulas (4A)–(6A) based on the above results, respectively, the change of the resonant frequencies is effectively controlled, and the response of the (N+1)th mode as a spurious mode is suppressed. Excellent resonant characteristics are therefore achieved.

As clearly understood from FIGS. 35, 37, and 39, when the thickness extensional vibration mode piezoelectric resonators 31–51 of series-connection type are used as a parallel-arm resonator of a ladder-type filter, by setting D'/D or $(D_1+D_2)/2D$ so as to meet the formulas (4B)–(6B), respectively, the rate of change of the antiresonant frequencies is within about ±0.3%.

As described above, by using a thickness extensional vibration mode piezoelectric resonator according to preferred embodiments of the present invention as a series-arm resonator or parallel-arm resonator, variations of the resonant frequency or antiresonant frequency are effectively controlled. Accordingly, a ladder-type filter having excellent filtering characteristics is provided.

According to the first preferred embodiment of the present invention, in an energy-trap piezoelectric resonator of parallel-connection type having N number of internal electrodes in a piezoelectric body and utilizing the (N−1)th mode of a thickness extensional vibration mode, when the thickness of a piezoelectric layer between adjacent internal electrodes is denoted by D and the thicknesses of a first and second piezoelectric layers outside the outermost internal electrodes in the direction of thickness are denoted by $D_1$ and $D_2$, since the piezoelectric resonator is constructed so as to meet the formula (2A) at N=3, formula (1A) at N=4, and formula (3A) at N=5, variations of the resonant frequency are greatly reduced, and the relative bandwidth of a higher-order spurious mode is significantly narrowed and accordingly, excellent resonant characteristics are achieved. Therefore, by using a thickness extensional vibration mode piezoelectric resonator according to the first preferred of the present invention defining a series-arm resonator of a ladder-type filter, it is possible to provide a ladder-type filter having a high accuracy of the center frequency and excellent filtering characteristics.

According to the second preferred embodiment of the invention, in an energy-trap piezoelectric resonator of parallel-connection type having N number of internal electrodes in a piezoelectric body and utilizing the (N−1)th mode of a thickness extensional vibration mode, when the thickness of a piezoelectric layer between adjacent internal electrodes is denoted by D and the thicknesses of a first and second piezoelectric layers outside the outermost internal electrodes in the direction of thickness are denoted by $D_1$ and $D_2$, since the piezoelectric resonator is constructed so as to meet the formula (2B) at N=3, formula (1B) at N=4, and formula (3B) at N=5, variations of the antiresonant frequency are minimized. Therefore, by using a thickness extensional vibration mode piezoelectric resonator according to the second preferred embodiment of the invention defining a parallel-arm resonator of a ladder-type filter, it is possible to provide a ladder-type filter having a high accuracy of the center frequency and excellent filtering characteristics.

According to the third preferred embodiment of the invention, in an energy-trap piezoelectric resonator of series-connection type having N number of internal electrodes in a piezoelectric body and utilizing the (N−1)th mode of a thickness extensional vibration mode, when the thickness of a piezoelectric layer between adjacent internal electrodes is denoted by D and the thicknesses of a first and second piezoelectric layers outside the outermost internal electrodes in the direction of thickness are denoted by $D_1$ and $D_2$, since the piezoelectric resonator is constructed so as to meet the formula (4A) at N=3, formula (5A) at N=4, and formula (6A) at N=5, variations of the resonant frequency are greatly reduced, and the relative bandwidth of a higher-order spurious mode is narrowed, and accordingly, excellent resonant characteristics are achieved. Therefore, by using a thickness extensional vibration mode piezoelectric resonator according to the third preferred embodiments of the present invention defining a series-arm resonator of a ladder-type filter, it is possible to provide a ladder-type filter having a high accuracy of the center frequency and excellent filtering characteristics.

According to the fourth preferred embodiment of the invention, in an energy-trap piezoelectric resonator of series-connection type having N number of internal electrodes in a piezoelectric body and utilizing the (N−1)th mode of a thickness extensional vibration mode, when the thickness of a piezoelectric layer between adjacent internal electrodes is denoted by D and the thicknesses of a first and second piezoelectric layers outside the outermost internal electrodes in the direction of thickness are denoted by $D_1$ and $D_2$, since the piezoelectric resonator is constructed so as to meet the formula (4B) at N=3, formula (5B) at N=4, and formula (6B) at N=5, variations of the antiresonant frequency are minimized. Therefore, by using a thickness extensional vibration mode piezoelectric resonator according to the fourth preferred embodiment of the present invention defining a parallel-arm resonator of a ladder-type filter, it is possible to provide a ladder-type filter having a high accuracy of the center frequency and excellent filtering characteristics.

Since in a ladder-type filter according to the fifth preferred embodiment of the present invention a series-arm resonator includes a thickness extensional vibration mode piezoelectric resonator according to the first or third preferred embodiments of the present invention and in a ladder-type filter according to the sixth preferred embodiment of the present invention a parallel-arm resonator includes a thickness extensional vibration mode piezoelectric resonator according to the second or fourth preferred embodiment of the present invention, the accuracy of the resonant frequency of the series-arm resonator and the antiresonant frequency of the parallel-arm resonator are greatly increased. Therefore, it is possible to provide a ladder-type filter where variations in the filtering characteristics are very small.

When a plurality of internal electrodes made of substantially linear electrodes intersect with each other through piezoelectric layers and the intersection portion constitutes an energy trap type piezoelectric vibrating portion, by adjustment of the area of the intersection portion of the linear electrodes, it is easy to construct a thickness extensional vibration mode piezoelectric resonator suitable for high-frequency applications.

In a piezoelectric resonator component according to preferred embodiments of the present invention, since a case substrate is bonded to a thickness extensional vibration mode piezoelectric resonator according to the first through fourth preferred embodiments of the present invention with a space for allowing the piezoelectric resonator to vibrate and a conductive cap is joined to the piezoelectric resonator so as to enclose the piezoelectric resonator, as a sealed chip-type piezoelectric resonator component the thickness extensional vibration mode piezoelectric resonator to be used as a parallel-arm resonator and series-arm resonator can constitute a ladder-type filter.

While the invention has been particularly shown and described with reference to preferred embodiments, it will be understood by those skilled in the art that the foregoing and other changes in form and details can be made without departing from the spirit and scope of the invention.

What is claimed is:

1. An energy-trap thickness extensional vibration mode piezoelectric resonator, comprising:
   a piezoelectric body including a plurality of piezoelectric layers and uniformly polarized in a thickness direction thereof; and
   N number of internal electrodes, where N equals 3, 4 or 5, arranged in the piezoelectric body on top of each other with the piezoelectric layers disposed therebetween; wherein
   the piezoelectric body vibrates in an (N−1)th higher-order mode of a thickness extensional vibration mode generated by applying electric fields of opposite polarity alternately In the direction of thickness to piezoelectric layers between internal electrodes and when the thickness of a piezoelectric layer between adjacent Internal electrodes in the direction of thickness is denoted by D and the thicknesses of a first and second piezoelectric layer outside the outermost internal electrodes in the direction of thickness are denoted by $D_1$ and $D_2$, the following relationships are satisfied: $0.50 \leq (D_1+D_2)/2D \leq 0.90$ at N=3 and 4, and $0.50 \leq (D_1+D_2)/2D \leq 0.80$ at N=5.

2. An energy trap thickness extensional vibration mode piezoelectric resonator according to claim 1, wherein the N number of internal electrodes include substantially linear electrodes and intersect with each other through piezoelectric layers, and wherein the intersection portion constitutes an energy trap type piezoelectric vibration portion.

3. An energy-trap thickness extensional vibration mode piezoelectric resonator, comprising:
   a piezoelectric body including a plurality of piezoelectric layers and uniformly polarized in a thickness direction thereof; and
   N number of Internal electrodes, where N equals 3, 4 or 5, arranged in the piezoelectric body on top of each other with the piezoelectric layers disposed therebetween; wherein
   the piezoelectric body vibrates in an (N−1)th higher-order mode of a thickness extensional vibration mode generated by applying electric fields of opposite polarity alternately in the direction of thickness to piezoelectric layers between internal electrodes, and when the thickness of a piezoelectric layer between adjacent internal electrodes In the direction of thickness is denoted by D and the thicknesses of a first and second piezoelectric layer outside the outermost internal electrodes In the direction of thickness are denoted by $D_1$ and $D_2$, the following relationships are satisfied: $0.10 \leq (D_1+D_2)/2D \leq 0.80$ at N=3, $0.10 \leq (D_1+D_2)/2D \leq 0.50$ at N=4, and $0.10 \leq (D_1+D_2)/2D \leq 0.45$ at N=5.

4. An energy trap thickness extensional vibration mode piezoelectric resonator according to claim 3, wherein the N number of internal electrodes include substantially linear electrodes and intersect with each other through piezoelectric layers, and wherein the intersection portion constitutes an energy trap type piezoelectric vibration portion.

5. An energy-trap thickness extensional vibration mode piezoelectric resonator, the piezoelectric resonator comprising:
   a piezoelectric body including a plurality of piezoelectric layers; and
   N number of internal electrodes, wherein N equals 3, 4 or 5, disposed In the piezoelectric body and stacked on each other with the piezoelectric layers disposed therebetween; wherein
   the piezoelectric body vibrates in an (N−1)th higher-order mode of a thickness extensional vibration mode and piezoelectric layers located between the internal electrodes are polarized in opposite direction alternately in the direction of thickness, and when the thickness of a piezoelectric layer between adjacent internal electrodes in the direction of thickness Is denoted by D and the thicknesses of a first and second piezoelectric layer outside the outermost internal electrodes in the direction of thickness are denoted by $D_1$ and $D_2$, the following relationships are satisfied: $0.60 \leq (D_1+D_2)/2D \leq 0.90$ at N=3, $0.65 \leq (D_1+D_2)/2D \leq 0.90$ at N=4, and $0.60 \leq (D_1+D_2)/2D \leq 0.80$ at N=5.

6. An energy trap thickness extensional vibration mode piezoelectric resonator according to claim 5, wherein the N number of internal electrodes include substantially linear electrodes and intersect with each other through piezoelectric layers, and wherein the intersection portion constitutes an energy trap type piezoelectric vibration portion.

7. An energy-trap thickness extensional vibration mode piezoelectric resonator, comprising:
   a piezoelectric body including a plurality of piezoelectric layers; and
   N number of internal electrodes, wherein N equals 3, 4 or 5, disposed in the piezoelectric body and stacked on each other with the piezoelectric layers disposed therebetween; wherein
   the piezoelectric body vibrates in an (N−1)th higher-order mode of a thickness extensional vibration mode and piezoelectric layers located between the internal electrodes are polarized in opposite direction alternately in the direction of thickness, and when the thickness of a piezoelectric layer between adjacent Internal electrodes in the direction of thickness is denoted by D and the thicknesses of a fist and second piezoelectric layer outside the outermost internal electrode in the direction of thickness are denoted by $D_1$ and $D_2$, the following relationships are satisfied: $0.10 \leq (D_1+D_2)/2D \leq 0.90$ at N=3, $0.10 \leq (D_1+D_2)/2D \leq 0.90$ at N=4, and $0.10 \leq (D_1+D_2)/2D \leq 0.80$ at N=5.

8. An energy trap thickness extensional vibration mode piezoelectric resonator according to claim 7, wherein the N number of internal electrodes include substantially linear electrodes and intersect with each other through piezoelectric layers, and wherein the intersection portion constitutes an energy trap type piezoelectric vibration portion.

9. A ladder-type filter comprising
a series-arm resonator including a thickness extensional vibration mode piezoelectric resonator according to claim 1; and
a parallel-arm resonator.

10. A ladder-type filter comprising
a series-arm resonator including a thickness extensional vibration mode piezoelectric resonator according to claim 5; and
a parallel-arm resonator.

11. A ladder-type filter comprising
a parallel-arm resonator including a thickness extensional vibration mode piezoelectric resonator according to claim 3; and
a series-arm resonator.

12. A ladder-type filter comprising a parallel-arm resonator including a thickness extensional vibration mode piezoelectric resonator according to claim 7; and
a series-arm resonator.

13. A piezoelectric resonator component comprising:
a thickness extensional vibration mode piezoelectric resonator according to claim 1;
a case substrate bonded to the piezoelectric resonator so as to define a space for allowing the piezoelectric resonator to vibrate; and
a conductive cap bonded to the case substrate so as to enclose the piezoelectric resonator.

14. A piezoelectric resonator component comprising:
a thickness extensional vibration mode piezoelectric resonator according to claim 3;
a case substrate bonded to the piezoelectric resonator so as to define a space for allowing the piezoelectric resonator to vibrate; and
a conductive cap bonded to the case substrate so as to enclose the piezoelectric resonator.

15. A piezoelectric resonator component comprising:
a thickness extensional vibration mode piezoelectric resonator according to claim 5;
a case substrate bonded to the piezoelectric resonator so as to define a space for allowing the piezoelectric resonator to vibrate; and
a conductive cap bonded to the case substrate so as to enclose the piezoelectric resonator.

16. A piezoelectric resonator component comprising:
a thickness extensional vibration mode piezoelectric resonator according to claim 7;
a case substrate bonded to the piezoelectric resonator so as to define a space for allowing the piezoelectric resonator to vibrate; and
a conductive cap bonded to the case substrate so as to enclose the piezoelectric resonator.

* * * * *